United States Patent
Jung et al.

(10) Patent No.: US 10,741,575 B2
(45) Date of Patent: Aug. 11, 2020

(54) VERTICAL TYPE SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Eun-Taek Jung, Seongnam-si (KR); Joong-Shik Shin, Yongin-si (KR); Byung-Kwan You, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/115,246

(22) Filed: Aug. 28, 2018

(65) Prior Publication Data

US 2019/0148399 A1     May 16, 2019

(30) Foreign Application Priority Data

Nov. 13, 2017   (KR) .................. 10-2017-0150741

(51) Int. Cl.
| | |
|---|---|
| H01L 27/11582 | (2017.01) |
| H01L 27/11556 | (2017.01) |
| H01L 29/66 | (2006.01) |
| H01L 21/311 | (2006.01) |
| H01L 29/788 | (2006.01) |
| H01L 29/792 | (2006.01) |
| H01L 27/1157 | (2017.01) |

(52) U.S. Cl.
CPC ... *H01L 27/11582* (2013.01); *H01L 21/31111* (2013.01); *H01L 27/1157* (2013.01); *H01L 27/11556* (2013.01); *H01L 29/66825* (2013.01); *H01L 29/66833* (2013.01); *H01L 29/7889* (2013.01); *H01L 29/7926* (2013.01)

(58) Field of Classification Search
CPC ......... H01L 27/11582; H01L 27/11556; H01L 29/66825; H01L 29/66833; H01L 29/7889; H01L 29/7926
See application file for complete search history.

(56) References Cited

U.S. PATENT DOCUMENTS

| | | | |
|---|---|---|---|
| 7,956,408 B2 | 6/2011 | Enda et al. | |
| 8,796,091 B2 | 8/2014 | Chang et al. | |
| 9,478,558 B2 | 10/2016 | Koka et al. | |
| 9,627,404 B2 | 4/2017 | Sasaki | |
| 2015/0194435 A1* | 7/2015 | Lee ................... | H01L 27/11575 257/329 |

(Continued)

*Primary Examiner* — Julia Slutsker
(74) *Attorney, Agent, or Firm* — F. Chau & Associates, LLC

(57) ABSTRACT

A vertical type semiconductor device includes a substrate that has a plurality of trenches, a support pattern that fills the plurality of trenches and protrudes from a top surface of the substrate, a semiconductor layer disposed on the substrate that fills a space between the support patterns, a stacked structure disposed on the support pattern and the semiconductor layer that includes a plurality of insulation layers and a plurality of first conducive patterns that are alternately and repeatedly stacked, and a plurality of channel structures that penetrate through the structure and the semiconductor layer and that extend into the support pattern. Each channel structure includes a channel layer. At least a portion of the channel layer makes contact with the semiconductor layer.

20 Claims, 49 Drawing Sheets

(56) References Cited

U.S. PATENT DOCUMENTS

| | | | |
|---|---|---|---|
| 2016/0056171 A1* | 2/2016 | Manorotkul | H01L 27/11526 257/66 |
| 2017/0033119 A1 | 2/2017 | Park | |
| 2017/0047342 A1 | 2/2017 | Hwang et al. | |
| 2017/0133389 A1 | 5/2017 | Yun et al. | |
| 2017/0148811 A1* | 5/2017 | Zhang | H01L 27/11575 |

* cited by examiner

FIG. 44
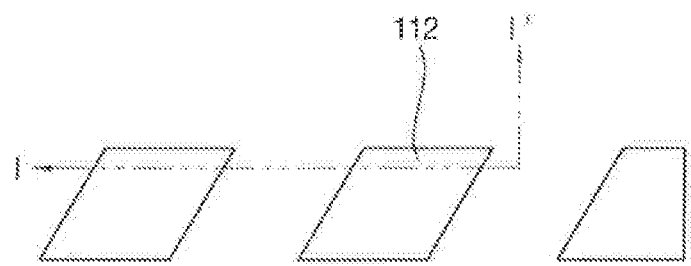
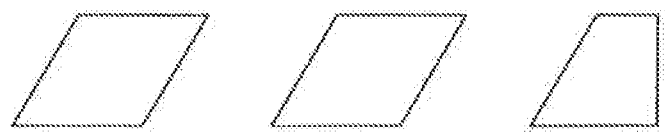
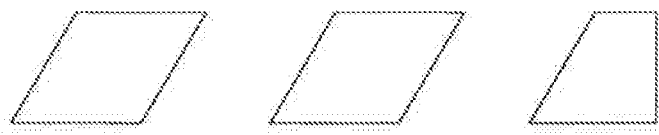
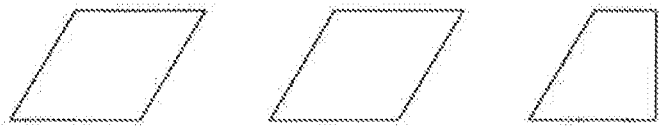
SECOND
DIRECTION
└── FIRST
     DIRECTION

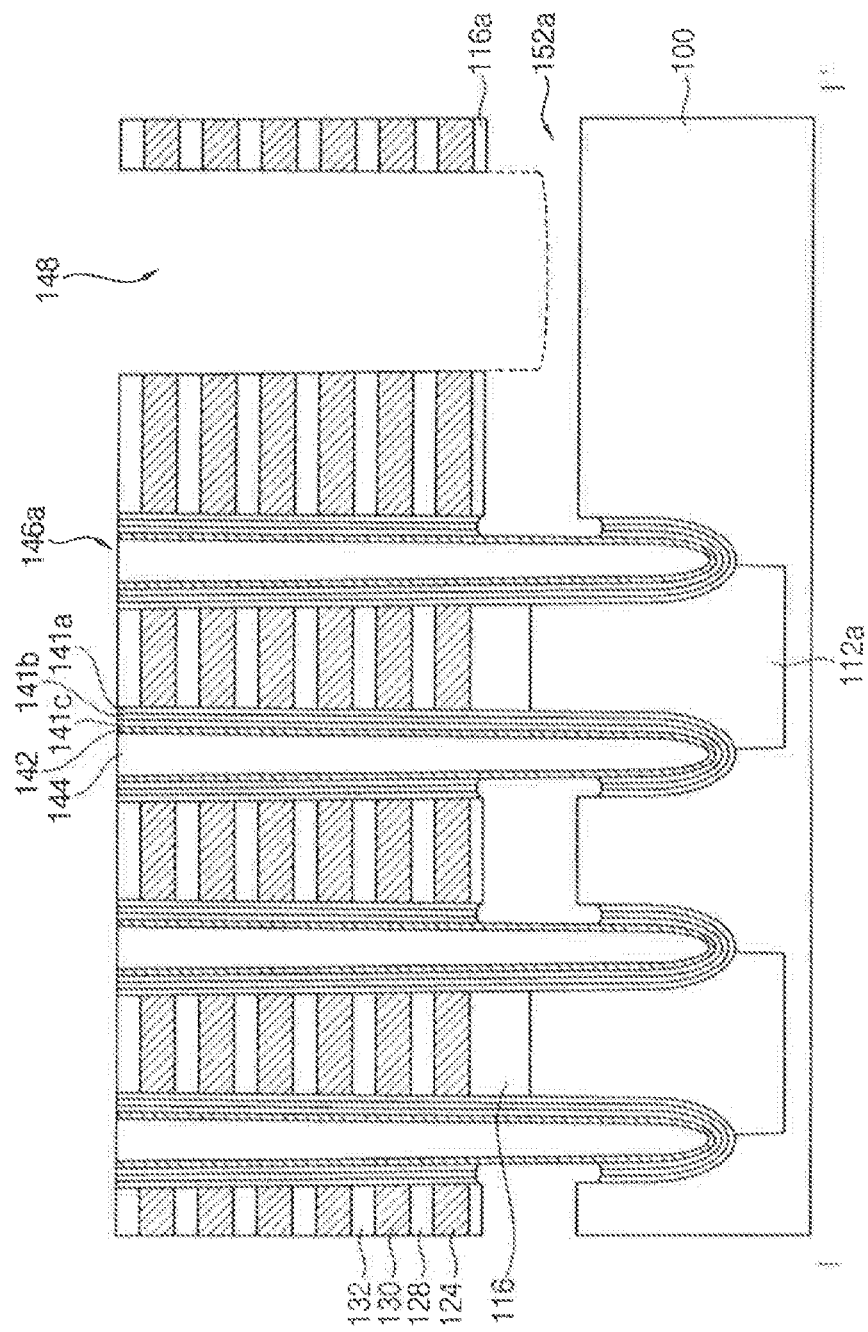

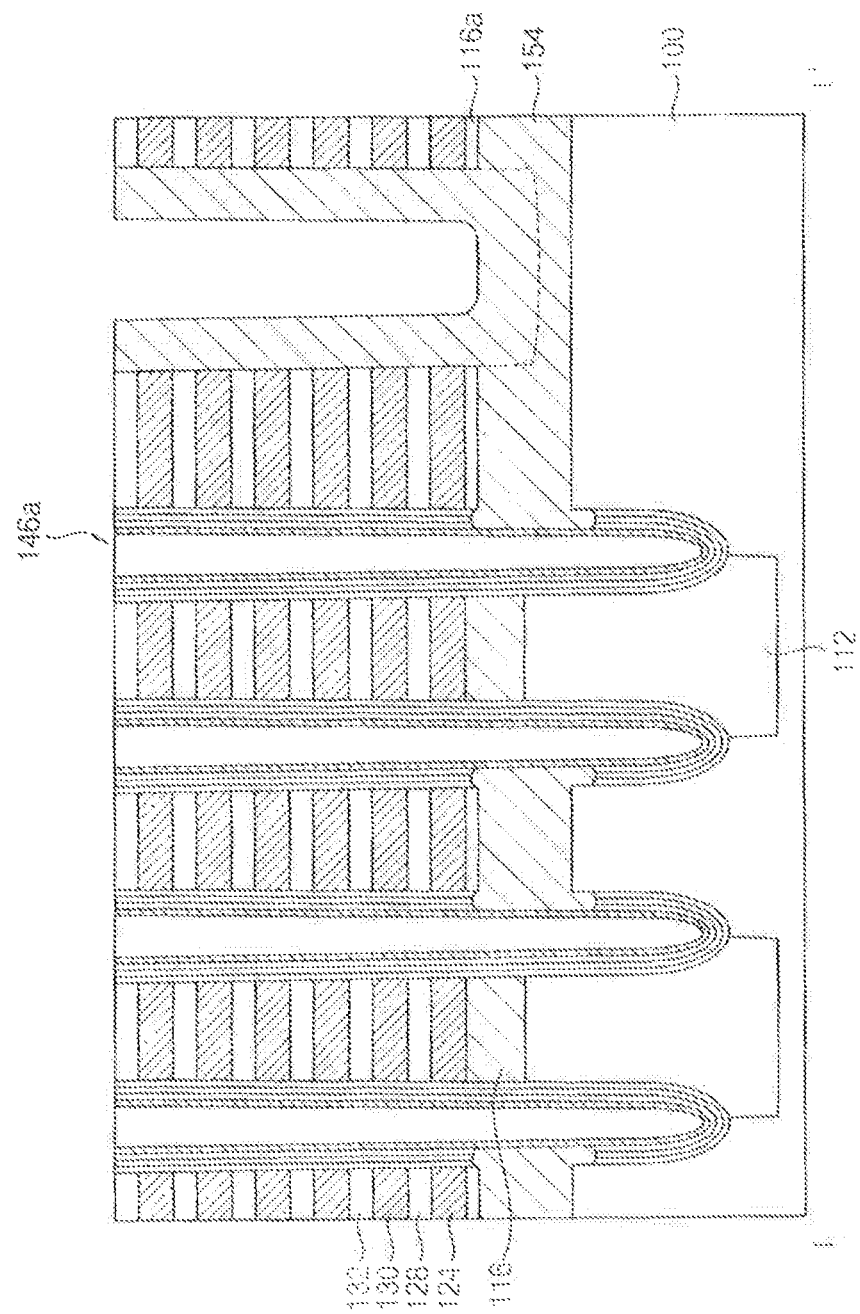

VERTICAL TYPE SEMICONDUCTOR DEVICES AND METHODS OF MANUFACTURING THE SAME

CROSS-REFERENCE TO RELATED APPLICATION

This application claims priority under 35 USC § 119 from, and the benefit of, Korean Patent Application No. 10-2017-0150741, filed on Nov. 13, 2017 in the Korean Intellectual Property Office (KIPO), the contents of which are herein incorporated by reference in their entirety.

BACKGROUND

1. Technical Field

Exemplary embodiments relate to semiconductor devices and methods of manufacturing the same. More particularly, exemplary embodiments relate to vertical type semiconductor devices and methods of manufacturing the same.

2. Discussion of the Related Art

In a vertical type NAND flash device, a silicon pattern may be provided in a lower portion of a channel structure. The silicon pattern may be formed by forming a channel hole and performing a selective epitaxial growth (SEG) process from a substrate exposed through a bottom surface of the channel hole. However, because a width of the channel hole is not uniform, a height of the silicon pattern is not uniform. In addition, an ONO layer formed on the silicon pattern to connect the silicon pattern and the channel polysilicon layer may need to be removed. However, as a depth of the channel hole is increased, removing the ONO layer on the silicon pattern may be challenging.

SUMMARY

Exemplary embodiments can provide a vertical type semiconductor device having good electrical characteristics.

According to exemplary embodiments, there is provided a vertical type semiconductor device. The vertical type semiconductor device includes a substrate that has a plurality of trenches, a support pattern that fills the plurality of trenches and that protrudes from a top surface of the substrate, a semiconductor layer disposed on the substrate that fills a space between the support patterns, a stacked structure disposed on the support pattern and the semiconductor layer that includes a plurality of insulation layers and a plurality of first conducive patterns that are alternately and repeatedly stacked, and a plurality of channel structures that penetrate through the stacked structure and the semiconductor layer and that extend into the support pattern. Each channel structure includes a channel layer. At least a portion of the channel layer makes contact with the semiconductor layer.

According to exemplary embodiments, there is provided a vertical type semiconductor device. The vertical type semiconductor device includes a substrate that has a plurality of trenches, a support pattern that fills the plurality of trenches and that protrudes from a top surface of the substrate, a polysilicon layer disposed on the substrate that fills a space between the support patterns, a stacked structure disposed on the support pattern and the polysilicon layer that includes a plurality of insulation layers and a plurality of first conducive patterns that are alternately and repeatedly stacked, and a plurality of channel structures that penetrate through the stacked structure and the polysilicon layer and that extend into the support pattern. The support pattern connects lower sidewalls of adjacent channel structures.

According to exemplary embodiments, there is provided a vertical type semiconductor device. The vertical type semiconductor device includes a substrate that has a plurality of trenches, a support pattern that fills the plurality of trenches and that protrudes from a top surface of the substrate, a polysilicon layer disposed on the substrate that fills a space between the support patterns, a stacked structure disposed on the support pattern and the polysilicon layer that includes a plurality of insulation layers and a plurality of first conducive patterns that are alternately and repeatedly stacked, a plurality of first channel structures that penetrate through the stacked structure and the polysilicon layer and that extend into the substrate, where each first channel structure includes a first channel layer, and a plurality of second channel structures that penetrate through the stacked structure and the polysilicon layer and that extend into the support pattern, where the second channel structure includes a second channel layer. At least a portion of each of the first and second channel layers makes contact with the polysilicon layer.

According to exemplary embodiments, a channel structure penetrates through a polysilicon layer and extends into a support pattern. A channel layer in the channel structure makes contact with the polysilicon layer. Accordingly, an open failure caused by electrical disconnection between the polysilicon layer and the channel layer can be prevented.

BRIEF DESCRIPTION OF THE DRAWINGS

FIGS. 44 to 49 are a plan view and cross-sectional views of a vertical type semiconductor device in accordance with exemplary embodiments.

DETAILED DESCRIPTION OF EMBODIMENTS

Hereinafter, exemplary embodiments will be more fully described with reference to the accompanying drawings.

Figure 1:
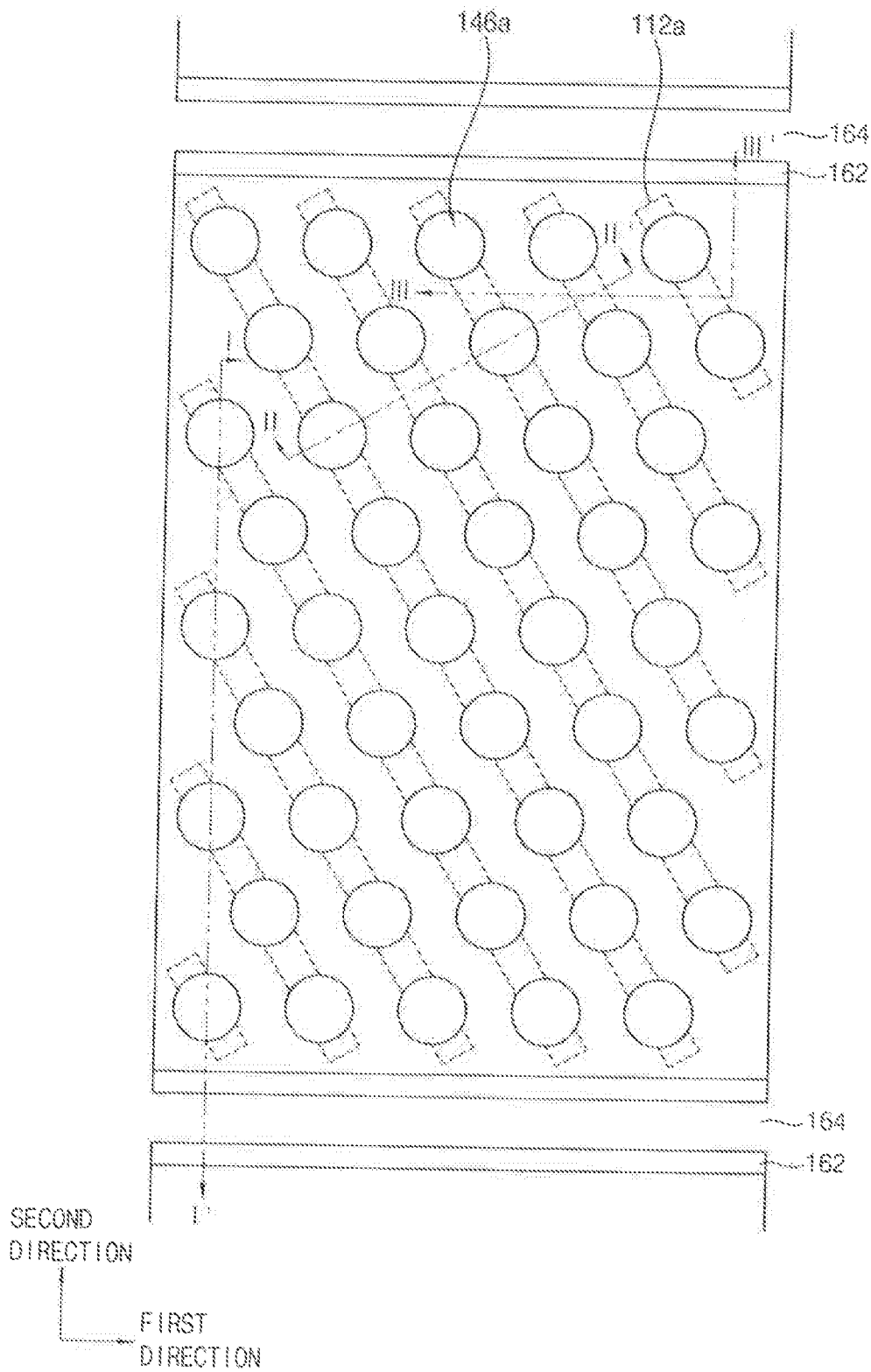
FIG. 1 is a plan view of a vertical type semiconductor device in accordance with exemplary embodiments.
Figure 2:
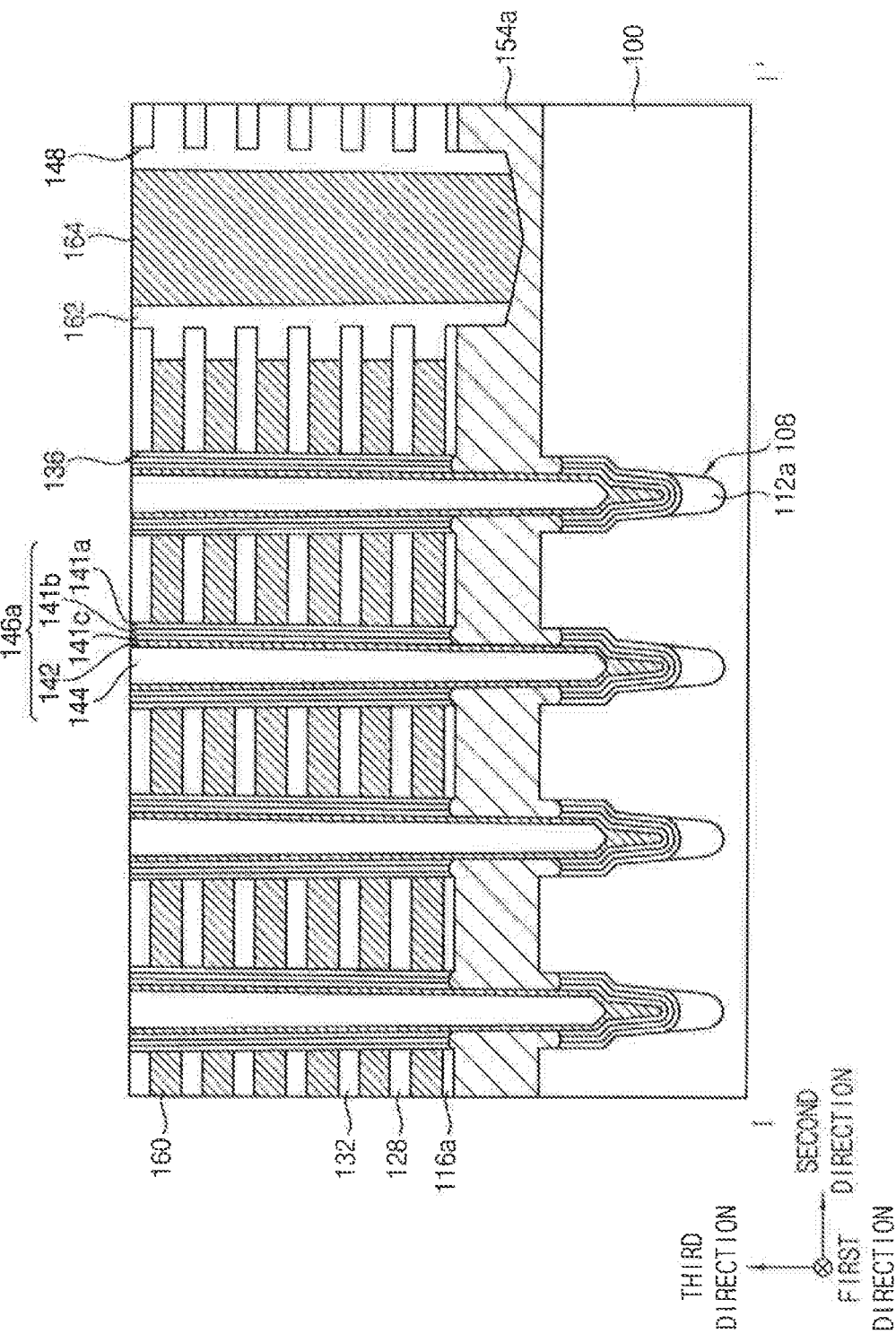
FIGS. 2, 3 and 4 are cross-sectional views of a vertical type semiconductor device in accordance with exemplary embodiments.
Figure 3:
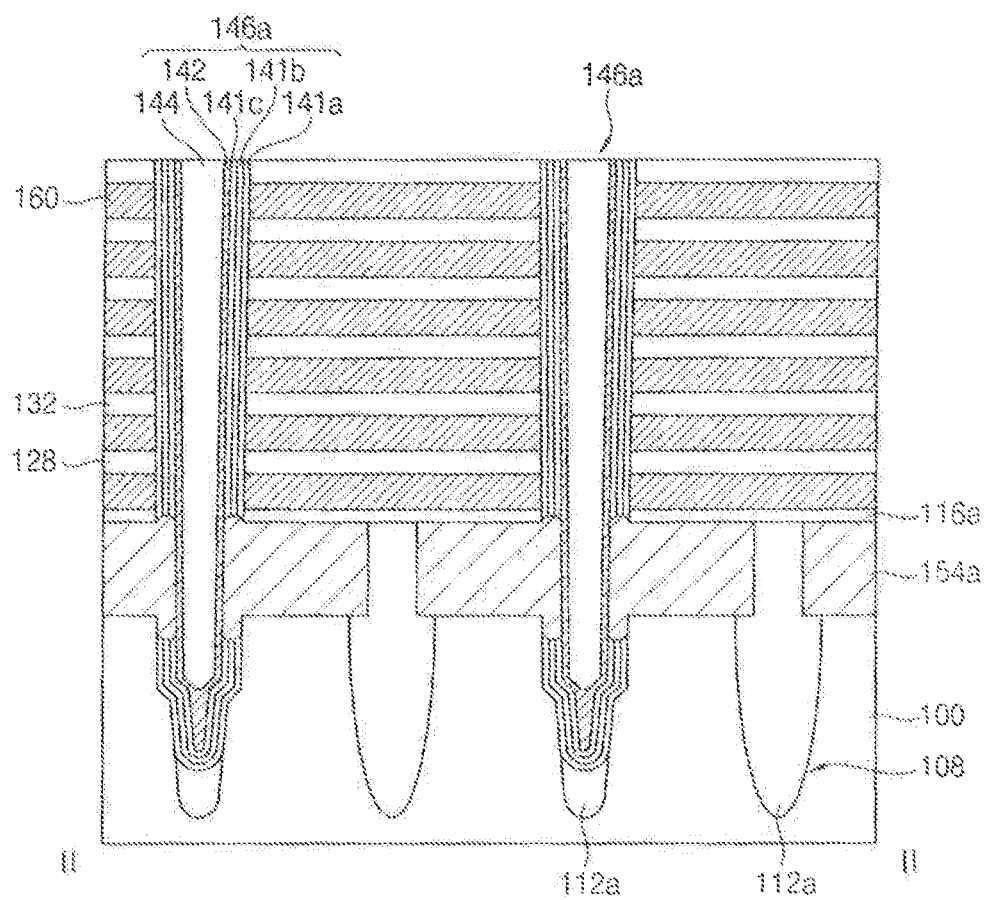
Figure 4:
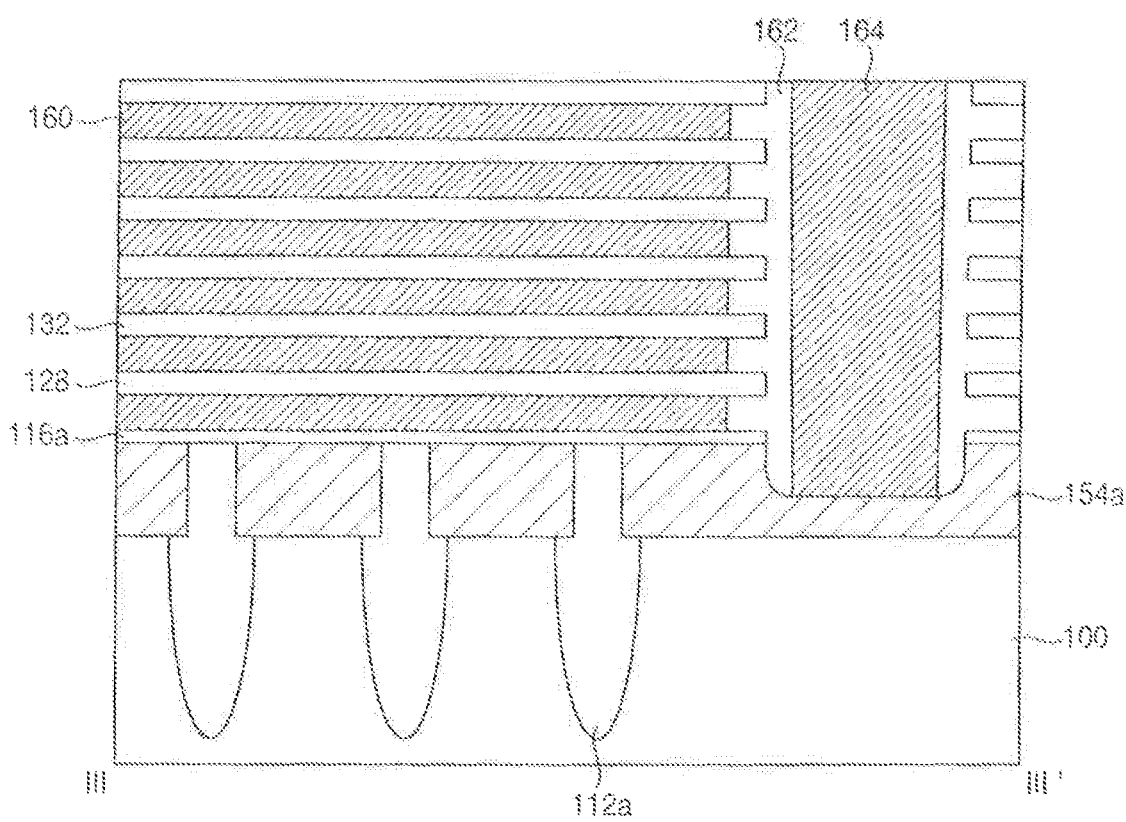

FIG. 1 is a plan view of a vertical type semiconductor device in accordance with exemplary embodiments. FIGS. 2, 3 and 4 are cross-sectional views of a vertical type semiconductor device in accordance with exemplary embodiments. FIG. 2 is a cross-sectional view taken along a line I-I' in FIG. 1, FIG. 3 is a cross-sectional view taken along a line II-II' in FIG. 1, and FIG. 4 is a cross-sectional view taken along a line III-III' in FIG. 1.

According to exemplary embodiments, two directions substantially parallel to a top surface of a substrate and substantially perpendicular to each other are referred to as a first direction and a second direction, respectively, and a direction substantially perpendicular to the top surface of the substrate is referred to as a third direction.

Referring to FIGS. 1 to 4, according to exemplary embodiments, a substrate 100 includes a cell region and a peri region. Cell block regions in which cell blocks are formed are included in the cell region. A cell structure is provided on the cell block region.

First, the cell structures disposed on the cell region of the substrate 100 will be described.

According to exemplary embodiment, first trenches 108 are formed in the cell region of the substrate 100 by partially etching the substrate 100. A support pattern 112a is disposed within each of the first trenches 108. The support pattern 112a fills the first trench 108 and protruded from a top surface of the substrate 100. The support pattern 112a includes an insulating material. The support pattern 112a includes a material having an etch selectivity with respect to polysilicon. In exemplary embodiments, the support pattern 112a includes silicon oxide.

In exemplary embodiments, the support pattern 112a is positioned in the cell block region and extends in a diagonal direction that forms an acute angle with respect to the first direction. The support pattern 112a has a linear shape that extends in the diagonal direction.

In exemplary embodiments, a portion of the support pattern 112a within the first trench 108 has a first width, and a portion of the support pattern 112a protruding from the top surface of the substrate 100 has a second width less than the first width.

In exemplary embodiments, a semiconductor layer is provided on the substrate 100 to fill a space between the support patterns 112a. The semiconductor layer is a polysilicon layer 154a. The polysilicon layer 154a functions as a semiconductor substrate or a semiconductor pattern.

In exemplary embodiments, top surfaces of the support pattern 112a and the polysilicon layer 154a are coplanar with each other. The top surfaces of the support pattern 112a and the polysilicon layer 154a are even.

In exemplary embodiments, a repeatedly stacked structure of insulation layers 116a, 128, 132 and a first conductive patterns 160 are formed on the polysilicon layer 154a and the support pattern 112a. In particular, a first lower insulation layer 116a is disposed on the polysilicon layer 154a and the support pattern 12a. The first conductive pattern 160 and a second lower insulation layer 128 are disposed on the first lower insulation layer 116a. The first conductive patterns 160 and the insulation layers 132 are alternately and repeatedly stacked on the second lower insulation layer 128.

In exemplary embodiments, the lowermost first conductive pattern 160 on the first lower insulation layer 116a serves as a ground selection line, and the first conductive pattern 160 on the second lower insulation layer 128 serves as word lines and a string selection line. For example, the uppermost first conductive pattern 160 serves as the string selection line.

In exemplary embodiments, the first conductive pattern 160 includes a first barrier layer and a first metal pattern. The first metal pattern includes tungsten. The first barrier layer may include titanium, titanium nitride, tantalum, tantalum nitride, etc.

In exemplary embodiments, the first lower insulation layer 116a has a thickness less than or substantially equal to those of the second lower insulation layer 128 and the insulation layers 132. That is, the thickness of the second lower insulation layer 128 need not be greater than the thickness of the insulation layer In exemplary embodiments, the first lower insulation layer 116a serves as a gate insulation layer of a ground selection transistor.

In exemplary embodiments, the stacked structure of insulation layers 116a, 128, 132 and first conductive patterns 160 has a linear shape that extends in the first direction. A plurality of the stacked structures are arranged along the second direction, and a third trench 148 is formed between the structures that extends in the first direction. The polysilicon layer 154a is exposed through a bottom surface of the third trench 148. The stacked structure is disposed on the cell block region. The third trench 148 is positioned in a word line cutting region.

In exemplary embodiments, an inner width of the third trench 148 is greater than the thickness in the third direction of the polysilicon layer 154a. In exemplary embodiments, the inner width of the third trench 148 is two times greater than the third direction thickness of the polysilicon layer 154a.

In exemplary embodiments, channel structures 146a are disposed that penetrate through the stacked structure and the polysilicon layer 154a down into the support pattern 112a. That is, the channel structures 146a are disposed on the support patterns.

In exemplary embodiments, all of the channel structures 146a are spaced apart by substantially a same interval on the support pattern 112a. In some embodiments, some of the channel structures 146a are disposed on the support pattern 112a. For example, in FIG. 1, only even-numbered support patterns 112a are provided, and odd-numbered support patterns are omitted, while all of the channel structures 146a are provided. In this case, approximately half of the channel structures are disposed on the support patterns 112a. Those channel structures not formed on the support pattern penetrate through the stacked structure and the polysilicon layer 154a and extend into the substrate 100 between the support patterns.

In exemplary embodiments, the channel structures 146a are disposed within a channel hole 136 which penetrates through the stacked structure and the polysilicon layer 154a and extends below a top surface of the support pattern 112a.

In exemplary embodiments, a portion of the support pattern 112a remains under the channel hole 136. The portion of the support pattern 112a under the channel structure 146a has a thickness that is less than the thickness of other portions of the support pattern 112a. In this case, the support pattern 112a has a linear shape that extends under a bottom of the channel structures 146a so that the support pattern 112a is unbroken. In some embodiments, there is no portion of the support pattern 112a under the channel hole 136. In this case, the support pattern 112a has a break adjacent to the channel structure 146a.

In exemplary embodiments, the support pattern 112a has a structure that connects lower sidewalls of adjacent channel structures 146a to each other.

In exemplary embodiments, a width of the channel hole 136 is equal to or greater than the first width of the support pattern 12a. The lower sidewall of the channel hole 136 under the polysilicon layer 154a has a narrowed portion, and thus, a lower width of the channel hole 136 is less than an upper width of the channel hole 136. In some embodiments, the width of the channel hole 136 is less than the first width.

In exemplary embodiments, the channel structure 146a includes a blocking layer 141a, a charge storage layer 141b, a tunnel insulation layer 141c, a channel layer 142 and a buried insulation layer 144 sequentially stacked on a surface of the channel hole 136. The charge storage layer 141b includes a nitride such as silicon nitride, and the blocking layer 141a, the tunnel insulation layer 141c and the buried insulation layer 144 include an oxide such as silicon oxide. The channel layer 142 includes polysilicon. In this case, the buried insulation layer 144 has a pillar shape that fills the channel hole 136.

In some embodiments, the channel structure 146a includes the blocking layer 141a, the charge storage layer 141b, the tunnel insulation layer 141c and the channel layer 142 sequentially stacked on the surface of the channel hole 136. In this case, the channel layer 142 has a hollow pillar shape that fills the channel hole 136.

In exemplary embodiments, the channel structure 146a includes a first portion positioned higher than the polysilicon layer 154a, a second portion positioned in the polysilicon layer 154a and a third portion positioned lower than the polysilicon layer 154a.

In exemplary embodiments, the blocking layer 141a is part of the first portion and the third portion. Therefore, the blocking layer 141a is severed is the second portion. The blocking layer 141a extends continuously from the lower sidewall to a bottom surface of the channel hole.

In exemplary embodiments, the charge storage layer 141b and the tunnel insulation layer 141c are part of the first portion and the third portion, respectively. Therefore, the charge storage layer 141b and the tunnel insulation layer 141c are severed in the second portion. The charge storage layer 141b and the tunnel insulation layer 141c extend continuously from the lower sidewall to the bottom surface of the channel hole 136.

In exemplary embodiments, the channel layer 142 continuously extends from the first to third portions. The channel layer 142 has a cylindrical shape. Accordingly, a lower sidewall of the channel layer 142 is in contact with the polysilicon layer 154. In particular, a portion of the channel layer 142 exposed through the severed blocking layer 141a, charge storage layer 141b and tunnel insulation layer 141c is in contact with the polysilicon layer 154a. The contacting portion of the channel layer 142 with the polysilicon layer 154a has an annular cylindrical shape.

In exemplary embodiments, when the channel layer 142 includes polysilicon, the channel layer 142 and the polysilicon layer 154a can be combined into one layer. The channel layer 142 and the polysilicon layer 154a are electrically connected to each other.

In exemplary embodiments, a bottom surface of the buried insulation layer 144 is lower than a bottom surface of the polysilicon layer 154a. That is, the lowermost bottom surface of the buried insulation layer 144 is lower than the top surface of the substrate 100.

In exemplary embodiments, a sidewall of the first conductive pattern 160 adjacent to the third trench 148 is recessed inward from the third trench 148 to form a recessed portion.

In exemplary embodiments, an insulation spacer 162 is disposed in the recess portion adjacent to the sidewall of the third trench 148 to fill the recess portion. The insulation spacer 162 includes silicon oxide.

In exemplary embodiments, a second conductive pattern 164 is disposed in the insulation spacer 162 that fills the third trench 148. The second conductive pattern 164 includes a second barrier layer and a second metal pattern. The second metal pattern includes tungsten. The second barrier layer may include titanium, titanium nitride, tantalum, tantalum nitride, etc.

In exemplary embodiments, a bottom surface of the second conductive pattern 164 is in contact with the polysilicon layer 154a. The second conductive pattern 164 extends in the first direction. The second conductive pattern 164 serves as a common source line.

In addition, a bit line contact and a bit line may be further disposed on the channel structure 146a to be electrically connected to the channel layer 142.

In exemplary embodiments, transistors are provided on the peri region of the substrate 100 to form a peri circuit. The transistors provided on the peri region will be described with reference to FIG. 19.

Figure 19:
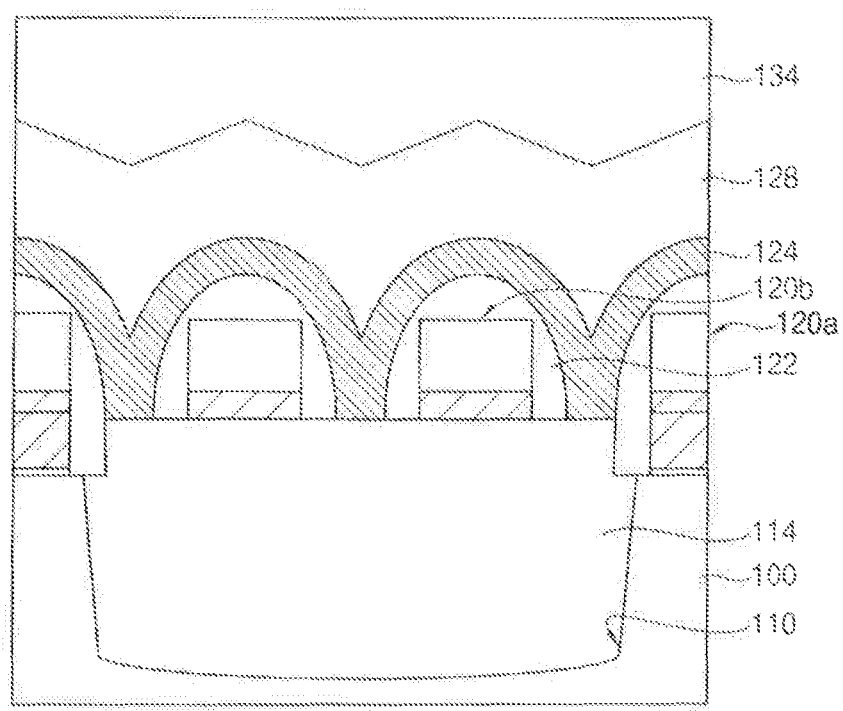

Referring to FIG. 19, according to exemplary embodiments, a second trench 110 is provided in the peri region of the substrate 100. An isolation layer pattern 114 is disposed within the second trench 110. The isolation layer pattern 114 includes a material substantially the same as the support pattern 112a. The isolation layer pattern 114 includes silicon oxide. In exemplary embodiments, an inner width of the second trench 110 is greater than an inner width of the first trench 108.

In exemplary embodiments, first and second gate structures 120a, 120b are disposed on the peri region of the substrate 100 and the isolation layer pattern 114, respectively. A spacer 122 is disposed on a sidewall of each of the first and second gate structures 120a, 120b.

In exemplary embodiments, the first gate structure 120a includes a gate insulation layer, a gate electrode and a hard mask and is disposed on an active region of the peri region of the substrate 100 where the isolation layer pattern 114 is not formed. In addition, the second gate structure 120b includes a gate electrode and a hard mask and is disposed on the isolation layer pattern 114 in the peri region of the substrate 100.

In exemplary embodiments, a second lower sacrificial layer 124 is disposed on the first and second gate structures 120a, 120b and the substrate 100. The second lower sacrificial layer 124 serves as an etch stop layer and a protection layer.

In exemplary embodiments, an insulation interlayer 134 is disposed on the second lower sacrificial layer 124.

As described above, according to exemplary embodiments, a vertical type semiconductor device includes the polysilicon layer 154a which makes contact with a lower sidewall of the channel layer 142 of the channel structure 146a. That is, the channel layer 142 and the polysilicon layer 154a are electrically connected to each other. Accordingly, although the number of stacked first conductive patterns is increased, a disconnection between the channel layer 142 and the polysilicon layer 154a can be prevented. Further, the thickness of the first and second lower insulation layers II 6a, 128 of the cell structure can be decreased to reduce the total height of the cell structure. Accordingly, effects due to increased height of the cell structure can be prevented.

FIGS. 5 to 35 are cross-sectional views and plan views that illustrate a method of manufacturing a vertical type semiconductor device in accordance with exemplary embodiments.

Figure 5:
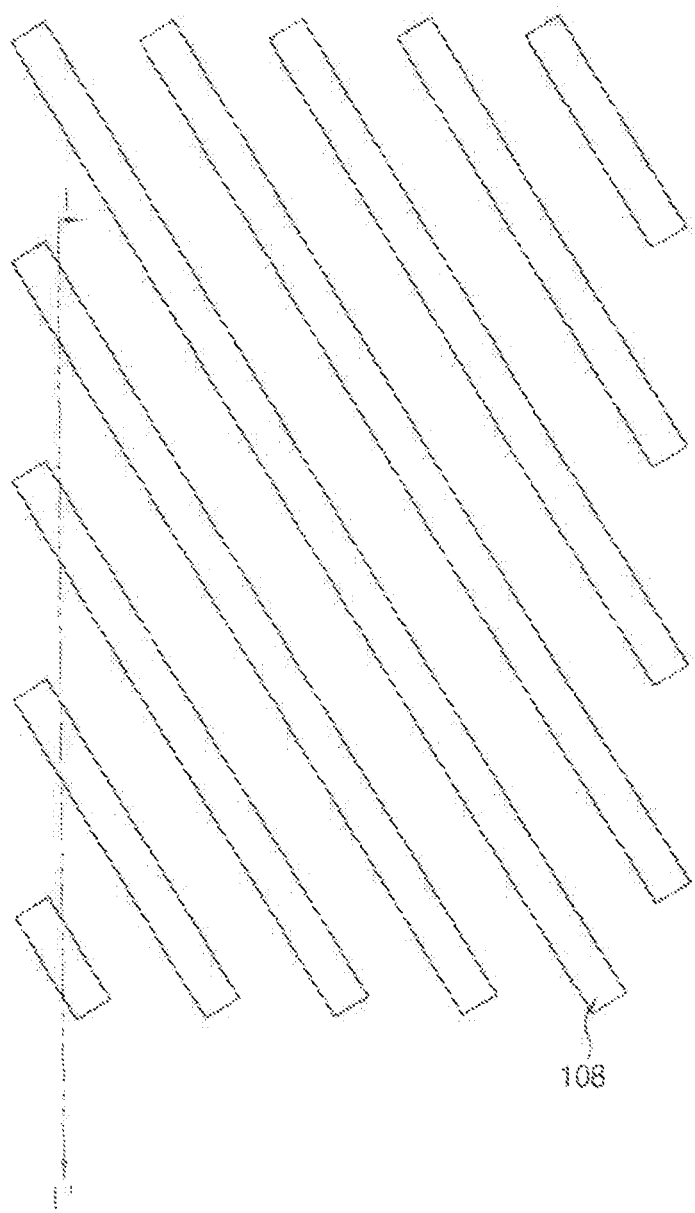
FIGS. 5 to 35 are cross-sectional views and plan views that illustrate a method of manufacturing a vertical type semiconductor device in accordance with exemplary embodiments.
Figure 20:
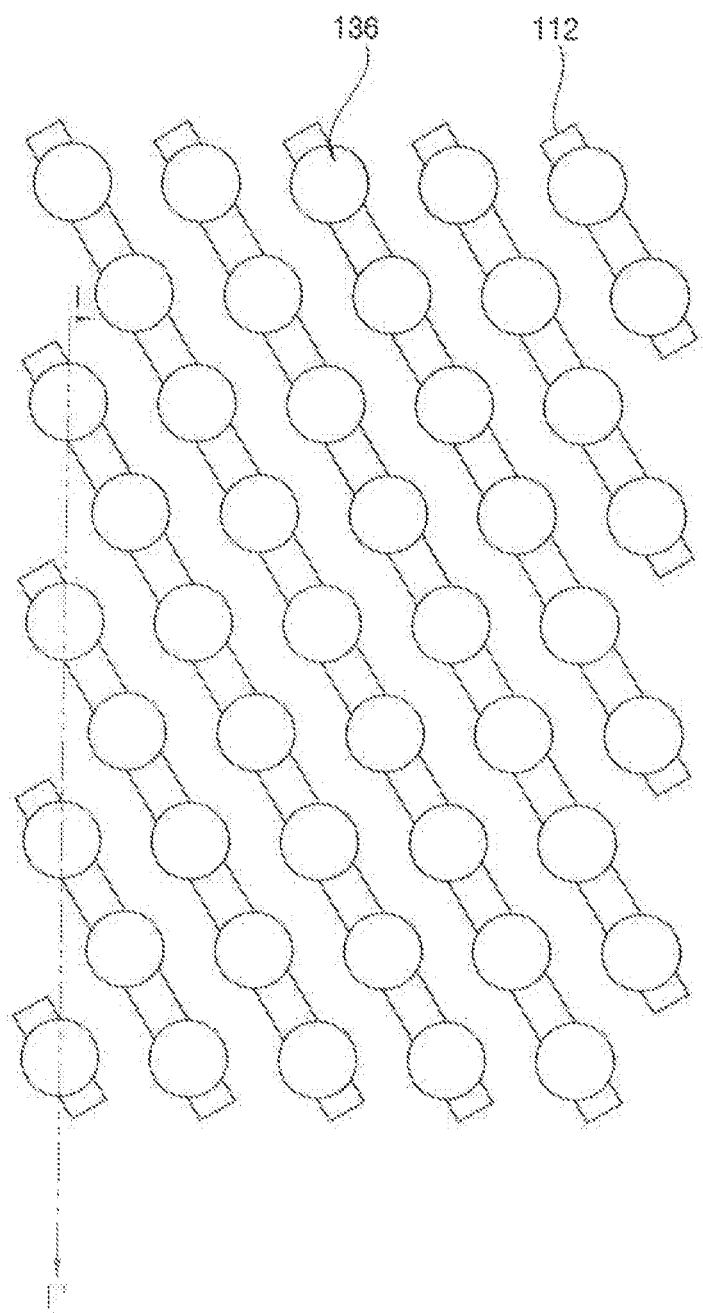
Figure 22:
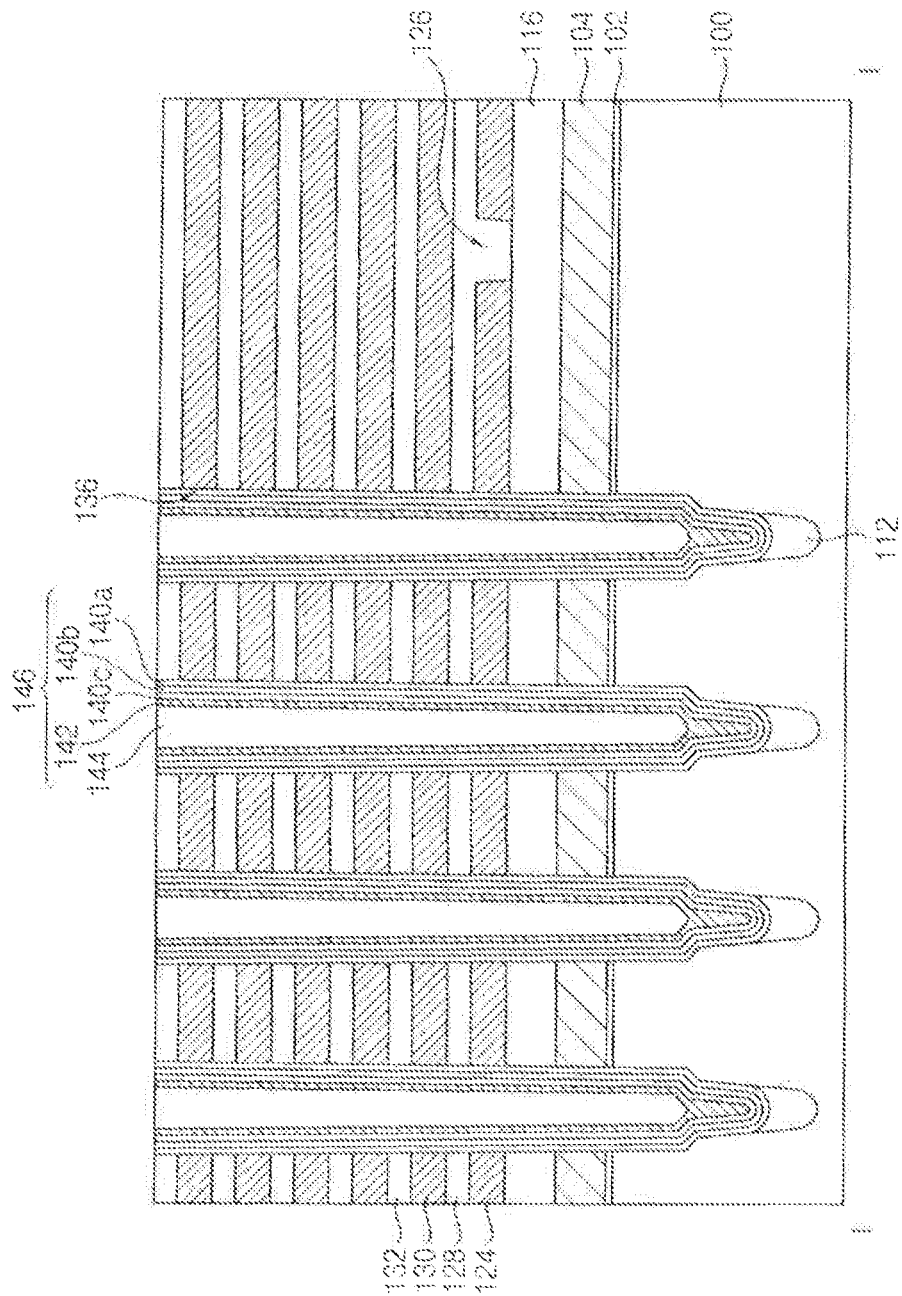
Figure 23:
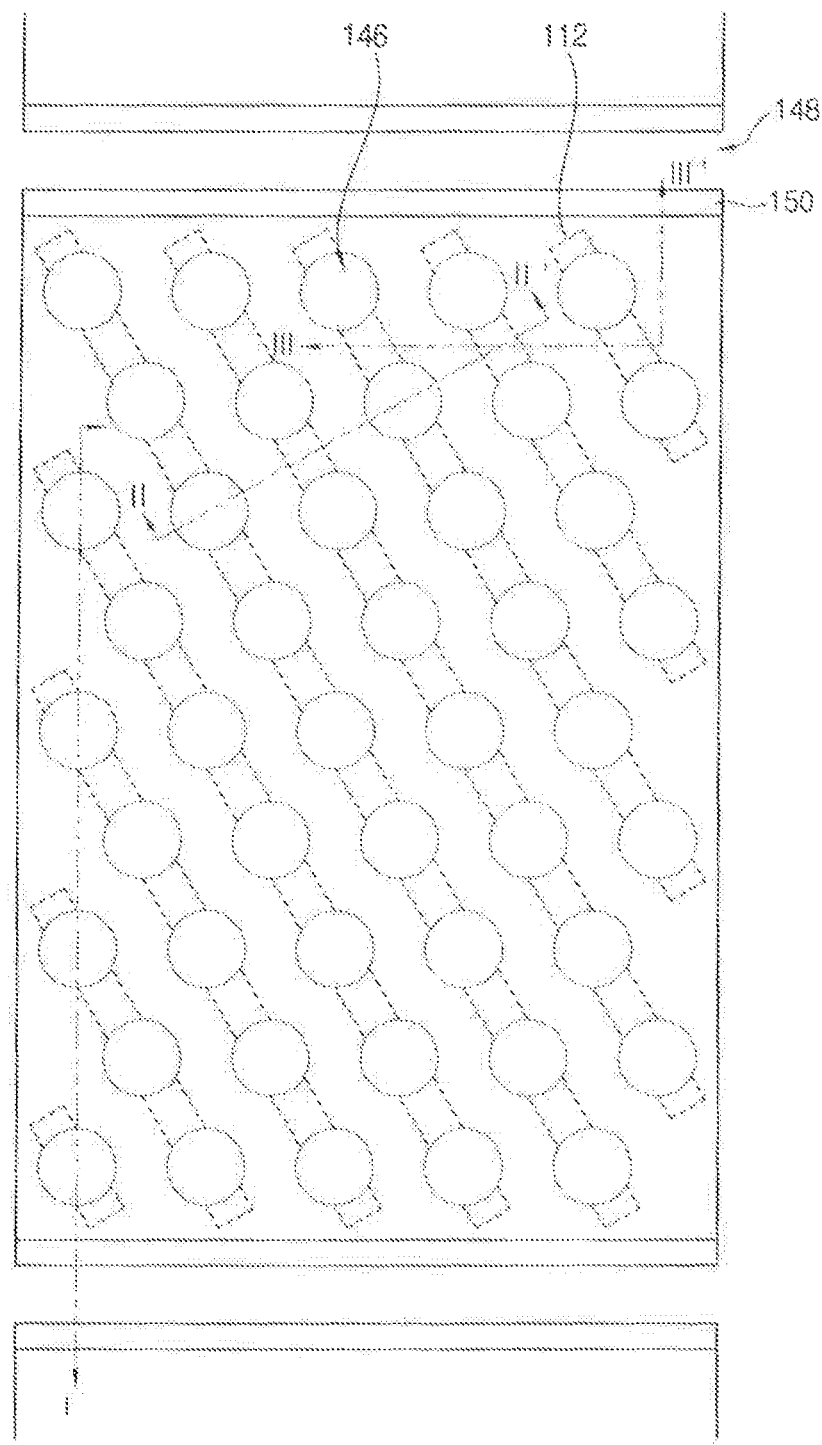
Figure 24:
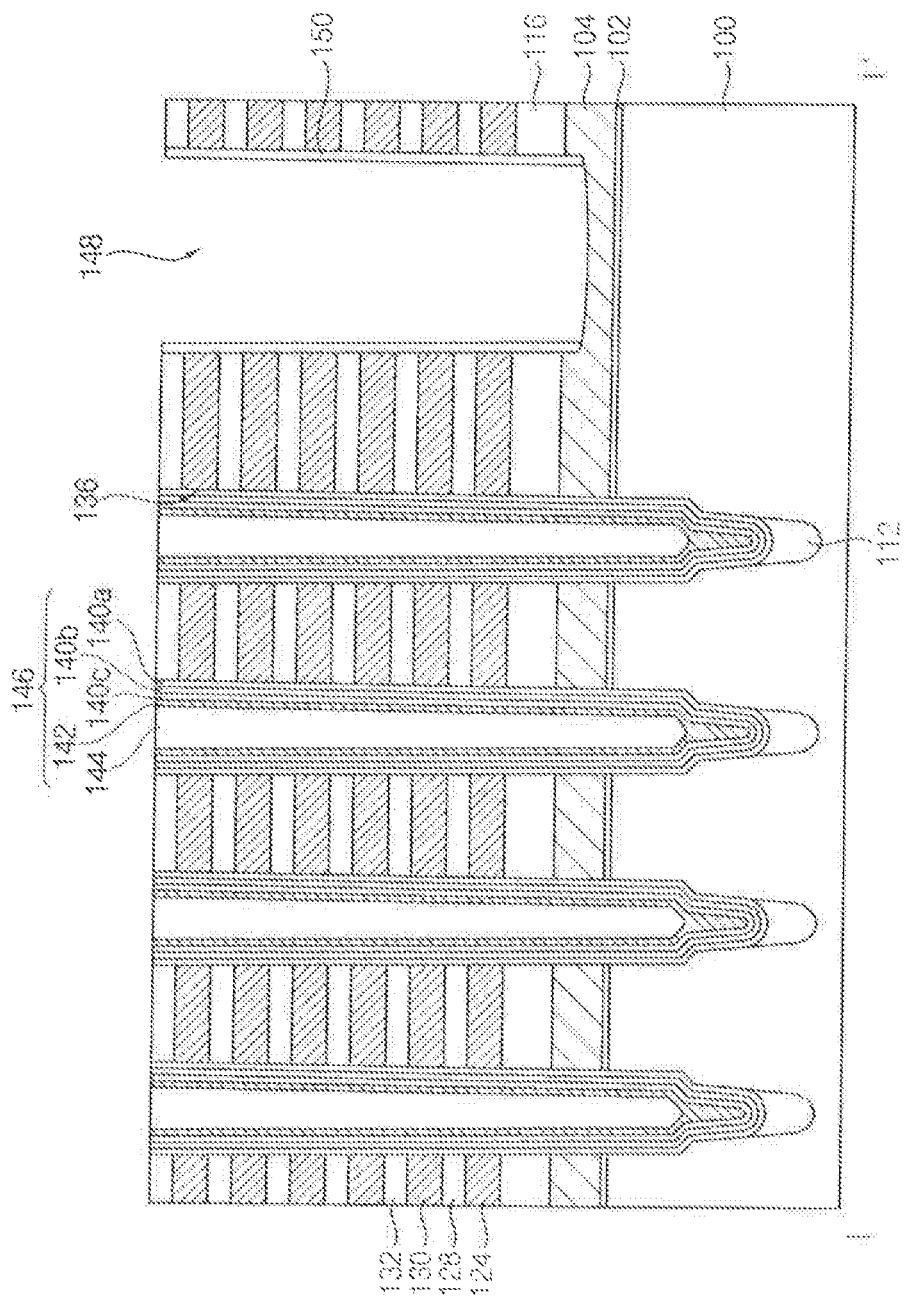
Figure 25:
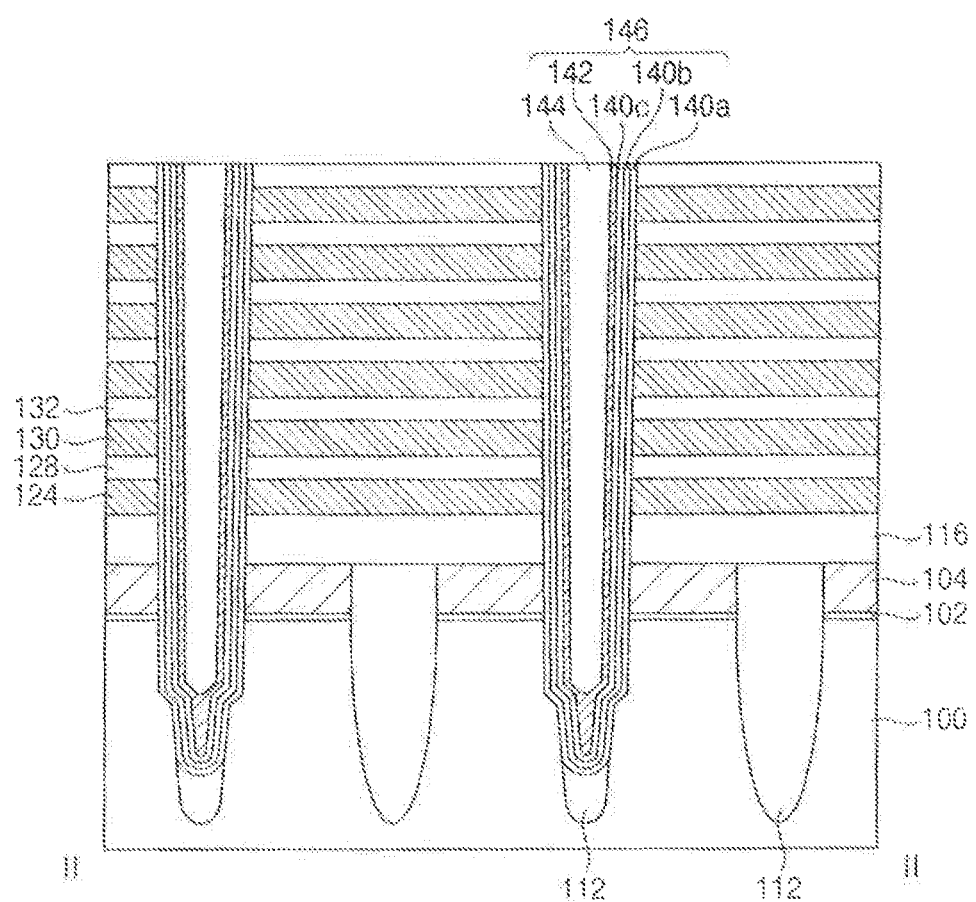
Figure 26:
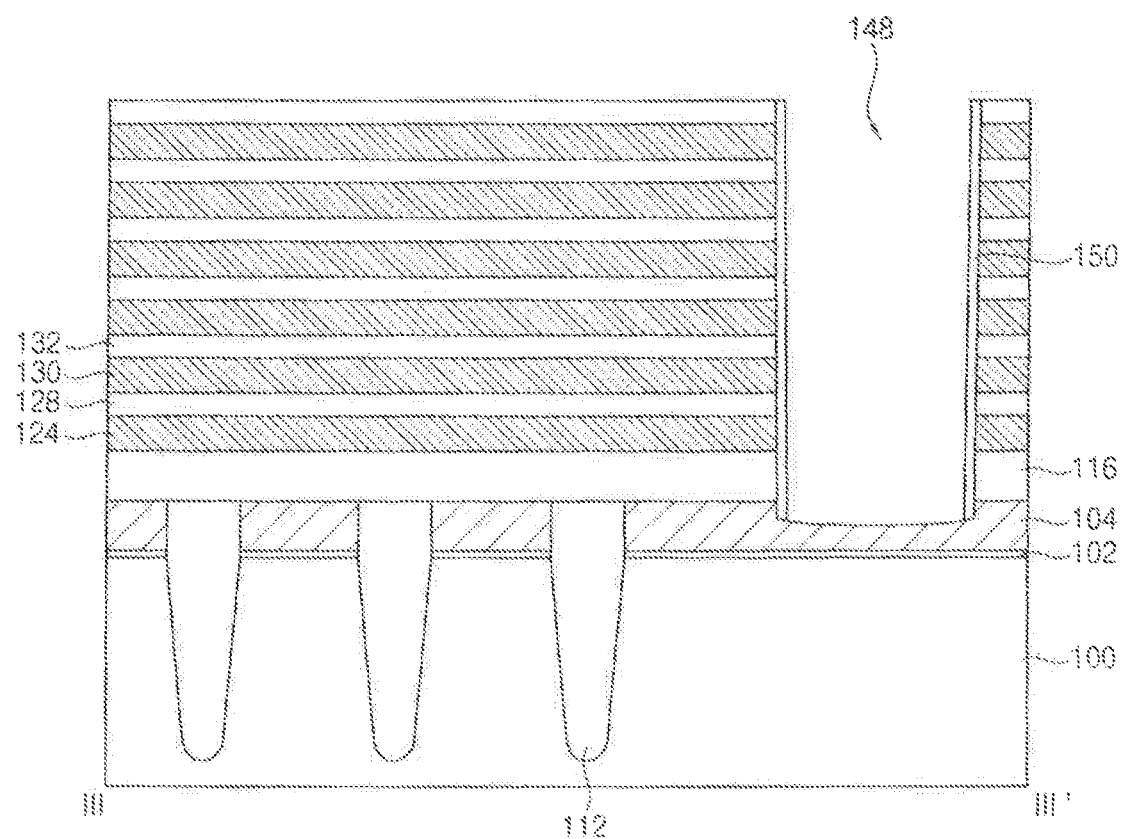

In particular, FIGS. 5, 20 and 23 are plan views, and FIGS. 6 to 18, 19, 21, 22 and 24 to 35 are cross-sectional views.

FIGS. 6, 8, 10, 12, 14, 16, 18, 21, 22, 24, 27, 30 and 33 are cross-sectional views taken along a line I-I' in FIG. 1, FIGS. 25, 28, 31 and 34 are cross-sectional views taken along a line II-II' in FIG. 1, and FIGS. 26, 29, 32 and 35 are cross-sectional views taken along a line III-III' in FIG. 1.

Figure 6:
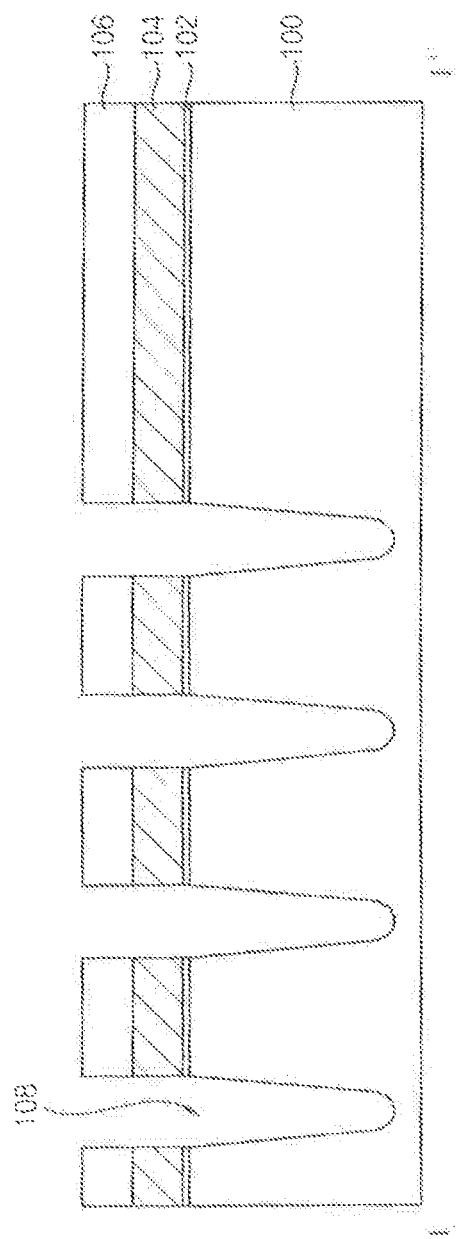
Figure 7:
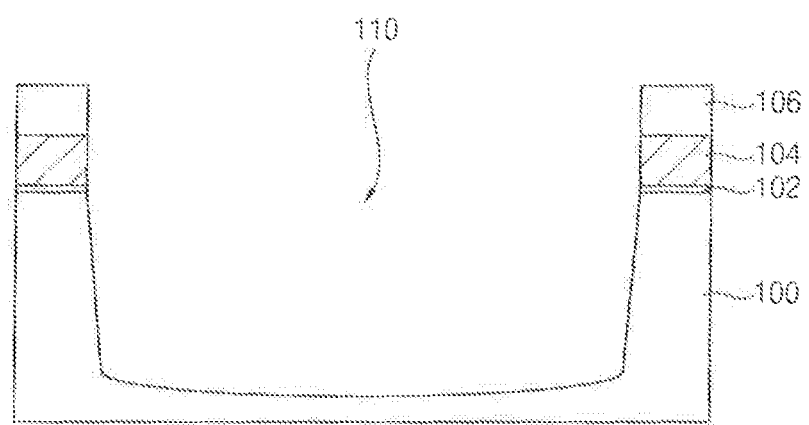

Referring to FIGS. 5 to 7, according to exemplary embodiments, a pad insulation layer 102 and a first lower sacrificial layer 104 are formed on a substrate 100 including a cell region and a peri region. A first hard mask 106 is formed on the first lower sacrificial layer 104.

In exemplary embodiments, the substrate 100 includes a semiconductor, such as silicon or germanium. Cell block regions are formed in the cell region of the substrate 100. The cell block regions are divided by a word line cutting region formed therebetween.

In exemplary embodiments, the pad insulation layer 102 includes silicon oxide. The pad insulation layer 102 in the peri region serves as a gate insulation layer of a transistor that forms a peri circuit.

In exemplary embodiments, the first lower sacrificial layer 104 in the peri region serves as a gate electrode. The first lower sacrificial layer 104 includes a material having an etch selectivity with respect to a second lower sacrificial layer and subsequently formed sacrificial layers. Accordingly, in subsequent processes, the second lower sacrificial layer and the other sacrificial layers are not removed, while the first lower sacrificial layer 104 is selectively removed. The first lower sacrificial layer 104 includes polysilicon.

In exemplary embodiments, the first hard mask 106 is formed by forming a silicon oxide layer and patterning the silicon oxide layer by a photolithography process. An exposing portion of the first hard mask 106 on the cell region corresponds to a region of the substrate 100 where a support pattern is to be formed. An exposing portion of the first hard mask 106 on the peri region corresponds to a region of the substrate 100 where an isolation layer pattern is to be formed.

Then, according to exemplary embodiments, the first lower sacrificial layer 104, the pad insulation layer 102 and the substrate 100 are anisotropically etched using the first hard mask 106. Accordingly, first trenches 108 are formed in the cell region, and a second trench 110 is formed in the peri region.

In exemplary embodiments, the first trench 108 partially overlaps with bottom surfaces of channel structures to be formed by subsequent process. In some embodiments, the first trench 108 overlaps with some of the channel structures. In this case, for example, some of the first trenches in FIG. 1 are omitted.

In exemplary embodiments, the first trench 108 may overlap with a portion of the bottom surface of the channel structure, or may overlap with the entire bottom surface of the channel structure.

In exemplary embodiments, the first trench 108 has a first width, and the first width is substantially equal to or less than a lower width of a subsequently formed channel structure. In some embodiments, the first width is greater than the lower width of the channel structure.

In exemplary embodiments, an inner width of the second trench 110 is greater than the width of the first trench 108.

Figure 8:
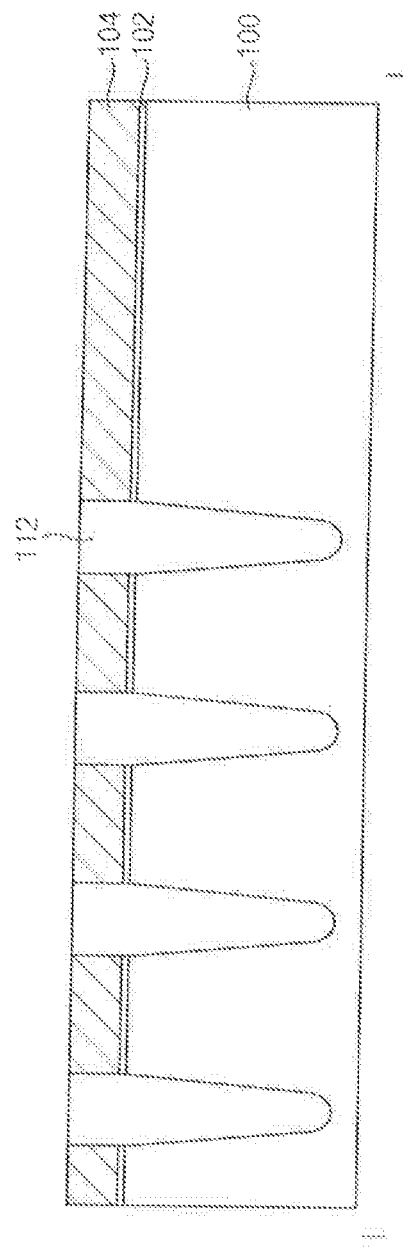
Figure 9:
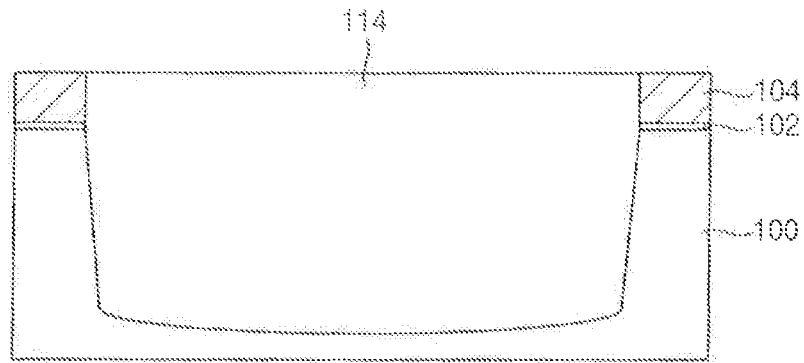

Referring to FIGS. 8 and 9, according to exemplary embodiments, an insulation layer is formed that completely fills the first and second trenches 108, 110 and is then planarized. Accordingly, a preliminary support pattern 112 is formed within the first trench 108, and an isolation layer pattern 114 is formed within the second trench 110.

In exemplary embodiments, because the preliminary support pattern 112 and the isolation layer pattern 114 are formed by the same deposition and planarization processes, the preliminary support pattern 112 and the isolation layer pattern 114 include the same material. Because the preliminary support pattern 112 is formed together with the isolation layer pattern 114, an additional process that forms the preliminary support pattern 112 is not required.

In exemplary embodiments, while performing the planarization process, the first hard mask 106 is completely removed to expose the first lower sacrificial layer 104. Accordingly, top surfaces of the preliminary support pattern 112, the isolation layer pattern 114 and the first lower sacrificial layer 104 are coplanar with each other. The planarization process includes a chemical mechanical polishing or etch back process.

Figure 10:
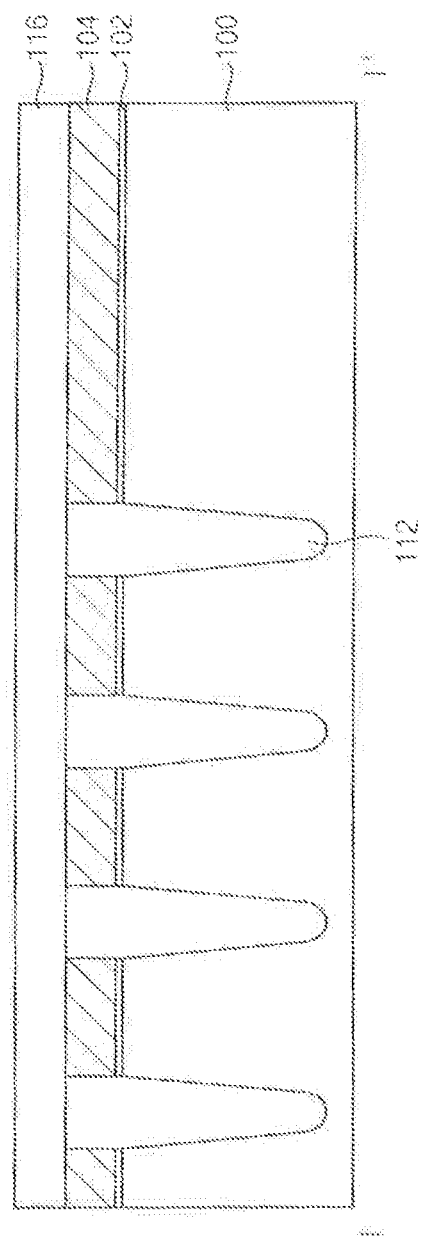
Figure 11:
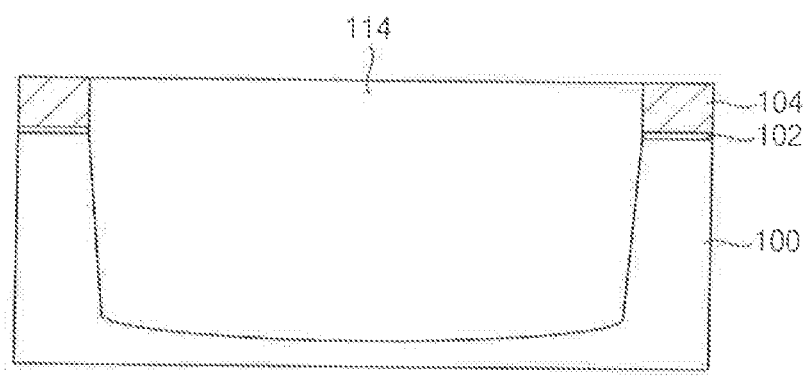

Referring to FIGS. 10 and 11, according to exemplary embodiments, an insulation layer is formed on the preliminary support pattern 112, the isolation layer pattern 114 and the first lower sacrificial layer 104, and a portion of the insulation layer on the isolation layer pattern 114 and the first lower sacrificial layer 104 is the peri region is removed to form a preliminary first lower insulation layer 116 in the cell region.

Accordingly, in exemplary embodiments, the top surfaces of the isolation layer pattern 114 and the first lower sacrificial layer 104 in the peri region are exposed. The preliminary first lower insulation layer 116 remain on the preliminary support pattern 112 and the first lower sacrificial layer 104 in the cell region.

Figure 12:
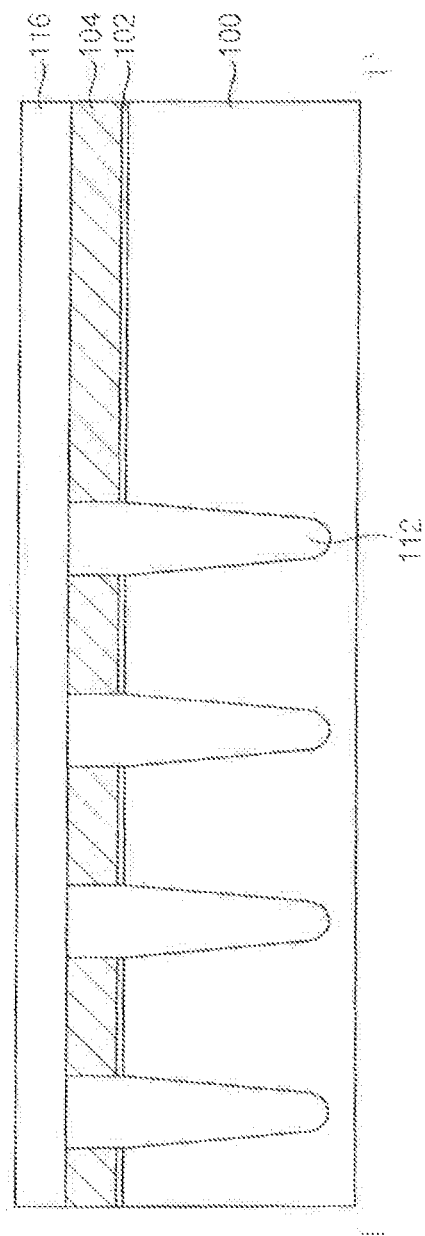
Figure 13:
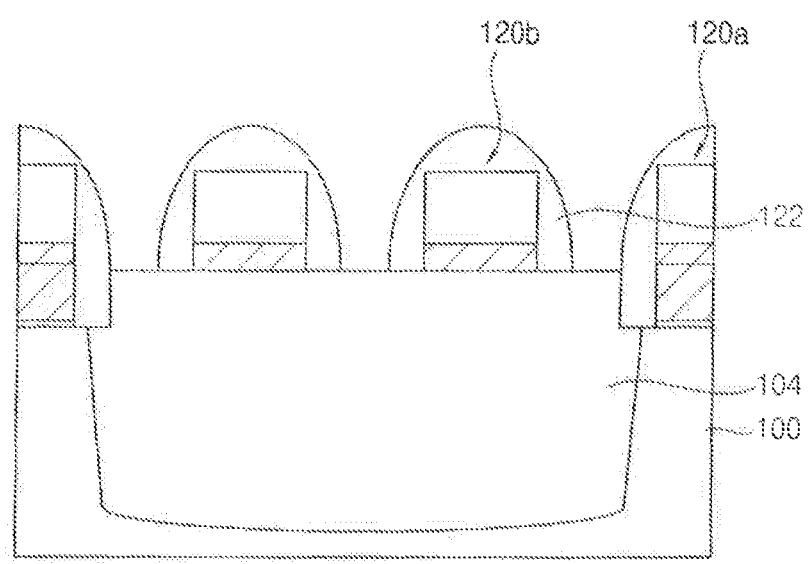

Referring to FIGS. 12 and 13, according to exemplary embodiments, first and second gate structures 120a, 120b are formed on the peri region of the substrate 100. A spacer 122 is formed on sidewalls of each of the first and second gate structures 120a, 120b.

In exemplary embodiments, a gate electrode layer and a hard mask are formed on the substrate, and the gate electrode layer, the first lower sacrificial layer and the pad insulation layer are etched using the hard mask as an etching mask.

Accordingly, in exemplary embodiments, the first gate structure 120a, which includes a gate insulation layer, a gate electrode and a hard mask, is formed on an active region of the peri region of the substrate 100 in which no isolation layer pattern 114 is formed. In addition, the second gate structure 120b, which includes a gate electrode and a hard mask, is formed on the isolation layer pattern 114 in the peri region of the substrate 100. The pad insulation layer 102 serves as a gate insulation layer of the first gate structure 120a. The first lower sacrificial layer 104 and the gate electrode serve together as a gate electrode.

In exemplary embodiments, a spacer layer is formed on the first and second gate structures 120a, 120b, the isolation layer pattern 114 and the substrate 100, and is then anisotropically etched to form the spacer 122. While the processes are being performed, a surface of the preliminary first lower insulation layer 116 on the cell region is partially etched, which reduces a thickness of the preliminary first lower insulation layer 116.

Figure 14:
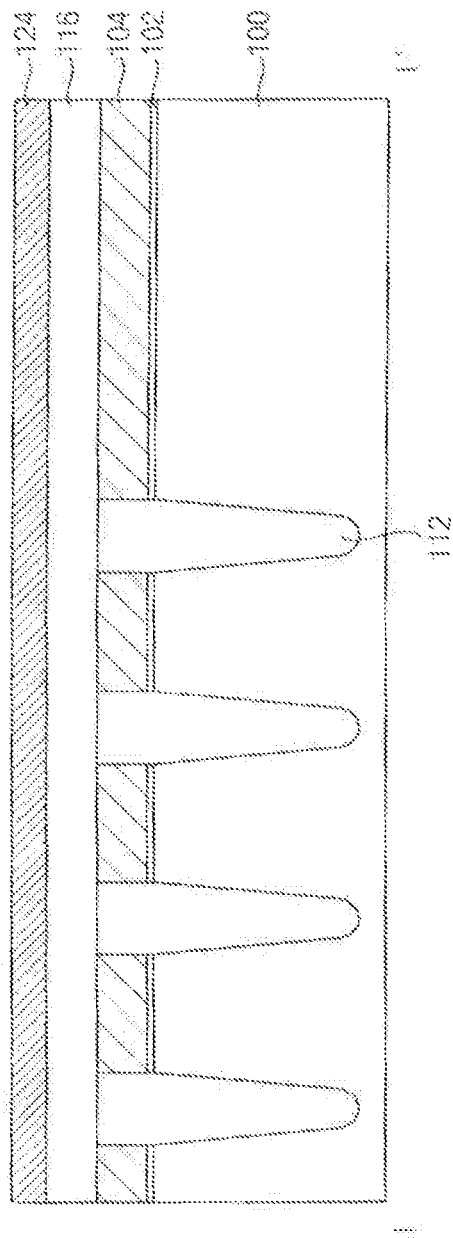
Figure 15:
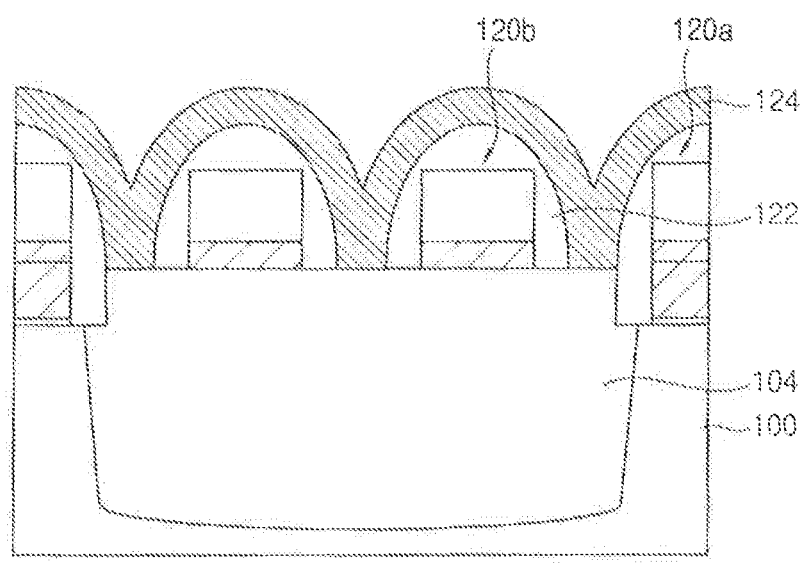

Referring to FIGS. 14 and 5, according to exemplary embodiments, a second lower sacrificial layer 124 is conformally formed on the preliminary first lower insulation layer 116, the spacer 122, the first and second gate structures 120a, 120b, the substrate 100 and the isolation layer pattern 114. The second lower sacrificial layer 124 includes silicon nitride.

In exemplary embodiments, the second lower sacrificial layer 124 on the cell region has a flat top surface. The second lower sacrificial layer 124 is removed from the cell region by a subsequent process to be replaced with a ground selection line. The second lower sacrificial layer 124 on the peri region is not removed and remains to serve as an etch stop layer and a protection layer.

Figure 16:
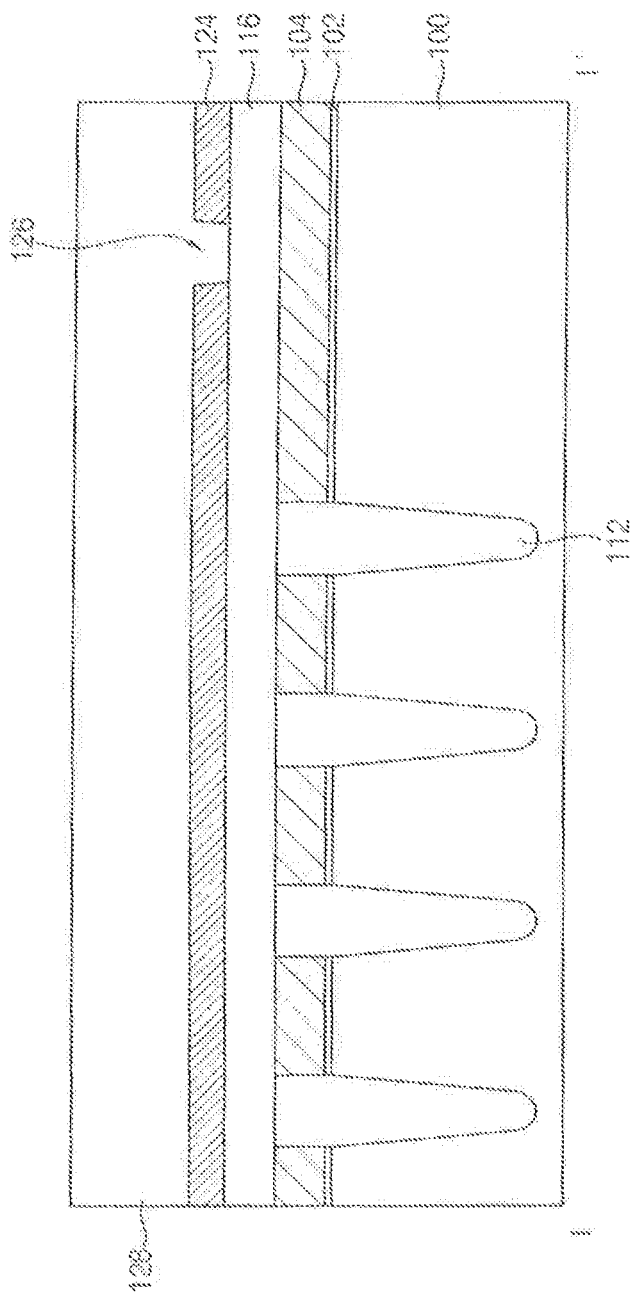
Figure 17:
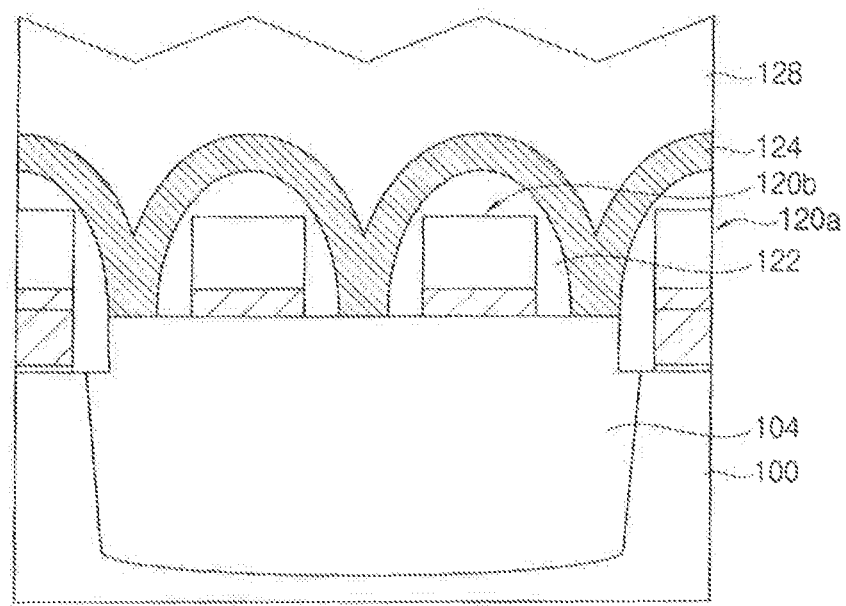

Referring to FIGS. 16 and 17, according to exemplary embodiments, a portion of the second lower sacrificial layer 124 that corresponds to a severed portion of the ground selection line is partially etched to form a first opening 126.

In exemplary embodiments, a preliminary second lower insulation layer is formed on the second lower sacrificial layer 124 that fills the first opening 126. Then, a top surface of the preliminary second lower insulation layer is planarized to form a second lower insulation layer 128.

In exemplary embodiments, the top surface of the preliminary second lower insulation layer is etched back to form the second lower insulation layer 128. In some embodiments, the preliminary second lower insulation layer is removed until the top surface of the second lower sacrificial layer 124 is exposed, and then, an insulation layer is deposited again on the second lower sacrificial layer 124 and the preliminary second lower insulation layer to form the second lower insulation layer 128.

In exemplary embodiments, a thickness of the second lower insulation layer 128 on the top surface of the second lower sacrificial layer 124 is less than the thickness of the preliminary first lower insulation layer 116.

In exemplary embodiments, although the first opening 126 corresponds to a severed portion of the ground selection line, the top surface of the second lower insulation layer 128 is flat. Accordingly, the sacrificial layers formed on the second lower insulation layer 128 have flat top surfaces. Thus, word lines and a string selection line that are subsequently formed have flat top surfaces.

In exemplary embodiments, the preliminary second lower insulation layer on the peri region is not removed and remains behind.

Figure 18:
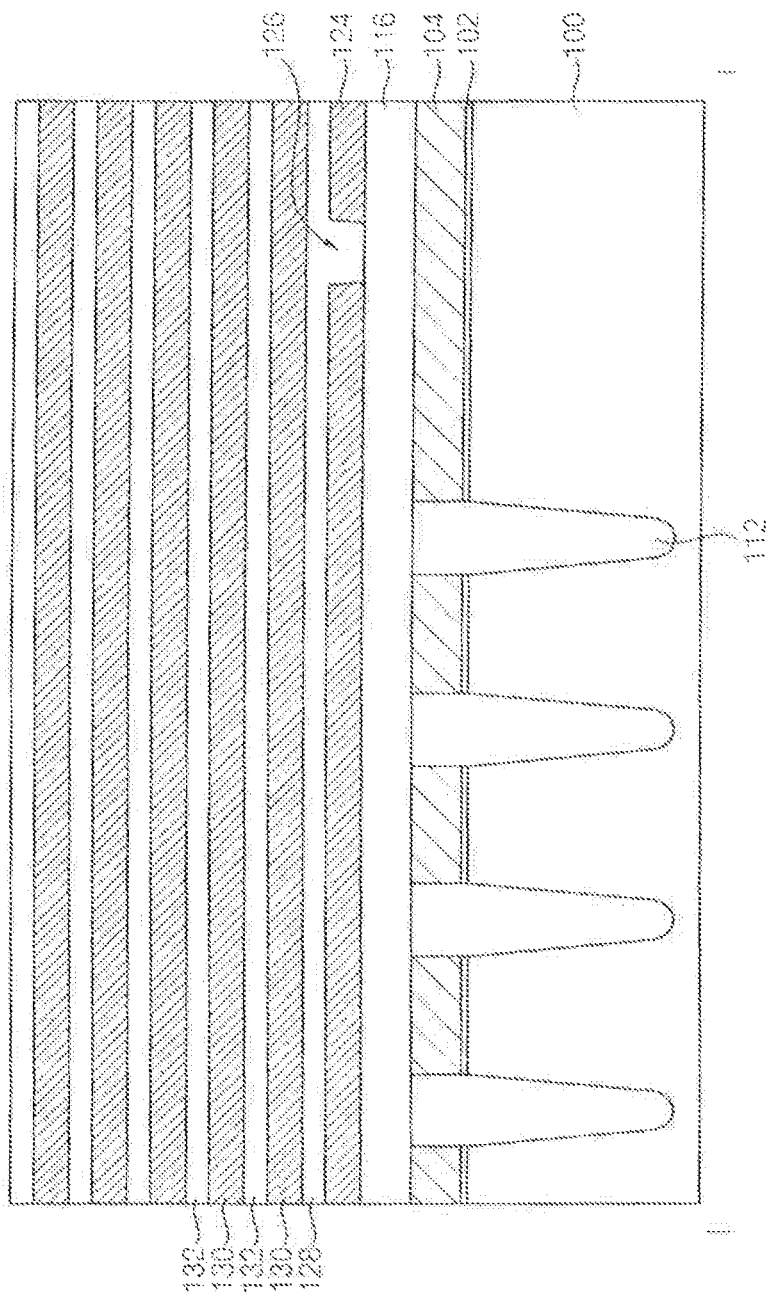

Referring to FIG. 18, according to exemplary embodiments, the sacrificial layers 130 and insulation layers 132 are alternately and repeatedly stacked on the second lower insulation layer 128.

In exemplary embodiments, the sacrificial layers 130 are subsequently replaced by word lines or a string selection line.

In exemplary embodiments, the insulation layer 132 includes silicon oxide, and the sacrificial layer 130 includes silicon oxide.

In exemplary embodiments, a thickness of the insulation layers 132 is substantially equal to or less than that of the second lower insulation layer 128. That is, the thickness of the second lower insulation layer 128 between the ground selection line and the word line is not greater than thicknesses of the insulation layers 132 between the word lines.

Then, in exemplary embodiments, the insulation layers 132, the sacrificial layers 130, the second lower insulation layer 128, the second lower sacrificial layer 124 and the preliminary first insulation layer 116 on a peripheral region of the cell region and the peri region are etched in stages, to form a mold structure that includes the pad insulation layer 102, the first lower sacrificial layer 104, the preliminary first lower insulation layer 116, the second lower sacrificial layer 124, the second lower insulation layer 128, and the insulation layers 132 and sacrificial layers 130 stacked on the cell region of the substrate 100. A lower portion of the mold structure is supported by the preliminary support pattern 112. Though the etch processes, an edge portion of the mold structure has a staircase shape.

As illustrated in FIG. 19, according to exemplary embodiments, the insulation layers 132, the sacrificial layers 130 and the second lower insulation layer 128 on the peri region are completely removed. Then, an insulation interlayer 134 is formed to cover the staircase portion of the mold structure on the cell region and the second lower sacrificial layer 124 on the peri region. Subsequent processes performed on the peri region are substantially the same as processes performed on the cell region, and accordingly, processes performed on the cell region will be described.

Figure 21:
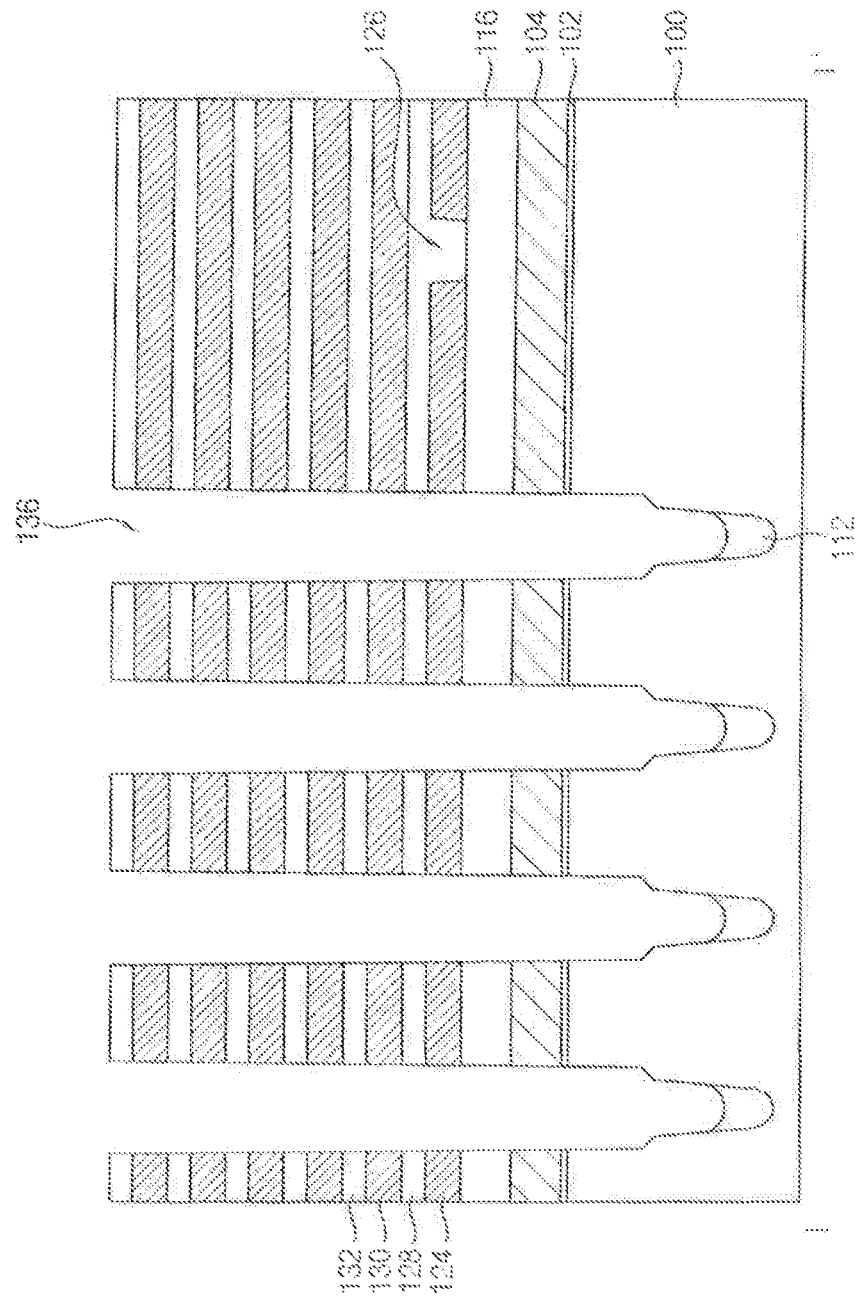

Referring to FIGS. 20 and 21, according to exemplary embodiments, the mold structure and the preliminary support pattern 112 under the mold structure are partially etched to form a plurality to channel holes 136 which penetrate the mold structure and extend into the preliminary support pattern 112. That is, the channel holes 136 formed on the preliminary support pattern 112.

In exemplary embodiments, a hard mask is formed on the mold structure, and then the mold structure is etched by a dry etch process using the hard mask as an etching mask to form the channel holes 136. A plurality of the channel holes 136 are formed along the first and second directions to define a hole array.

In exemplary embodiments, all of the channel holes 136 are periodically arranged on the preliminary support pattern 112. In some embodiments, some of the channel holes 136 are arranged on the preliminary support pattern 112.

In exemplary embodiments, the channel hole 136 are formed by sequentially etching the insulation layers 132, the sacrificial layers 130, the second lower insulation layer 128, the second lower sacrificial layer 124, the preliminary first lower insulation layer 116, the first lower sacrificial layer 104 and the pad insulation layer 102, and then, partially etching the preliminary support pattern 112. Accordingly, at least a portion of the preliminary support pattern 112 remains at a bottom of the channel hole 136. In some embodiments, the channel hole 136 is formed by sequentially etching the insulation layers 132, the sacrificial layers 130, the second lower insulation layer 128, the second lower sacrificial layer 124, the preliminary first lower insulation layer 116, the first lower sacrificial layer 104 and the pad insulation layer 102, and then etching the preliminary support pattern 112. In this case, no preliminary support pattern 112 remains at the bottom of the channel hole 136 or on a sidewall of the channel hole 136.

In exemplary embodiments, a width of the channel hole 136 is the same as or greater than the first width of the preliminary support pattern 112. The channel hole has a narrower portion toward a bottom thereof. Thus, a lower width of the channel hole 136 is less than an upper width of the channel hole 136.

Referring to FIG. 22, according to exemplary embodiments, a preliminary blocking layer 140a, a preliminary charge storage layer 140b, a preliminary tunnel insulation layer 140c and a channel layer 142 are sequentially and conformally formed on an inner wall of the channel hole 136 and the top surface of the preliminary support pattern 112. A buried insulation layer 144 is formed on the channel layer 142 that completely fills the channel holes 136. Accordingly, a preliminary channel structure 146 that includes the buried insulation layer 144, the channel layer 142, the preliminary tunnel insulation layer 140c, the preliminary charge storage layer 140*b* and the preliminary blocking layer 140*a* is formed within the channel hole 136.

In exemplary embodiments, the preliminary blocking layer 140*a* is formed of an oxide such as silicon oxide, the preliminary charge storage layer 140*b* is formed of a nitride such as silicon nitride, and the preliminary tunnel insulation layer 140*c* is formed of an oxide such as silicon oxide.

In exemplary embodiments, the channel layer 142 is formed of polysilicon.

In exemplary embodiments, the buried insulation layer 144 is formed of silicon oxide. A lowermost bottom surface of the buried insulation layer 144 extends below the top surface of the substrate.

In exemplary embodiments, the preliminary support pattern 112 connects lower portions of the preliminary channel structures 146 to each other. The preliminary support pattern 112 is disposed in a portion of the substrate 100 between the preliminary channel structures 146.

In exemplary embodiments, the preliminary channel structures 146 support the mold structure during subsequent processes. The preliminary support patterns 112 below the preliminary channel structures 146 also support the mold structure. Accordingly, because the mold structure is supported by the preliminary channel structure 146 and the preliminary support pattern 112, the sacrificial layers 130 and the insulation layers 132 of the mold structures are prevented from collapsing or deforming.

Referring to FIGS. 23, 24 25, and 26, according to exemplary embodiments, the insulation layers 132, the sacrificial layers 30, the second lower insulation layer 128, the second lower sacrificial layer 124, and the preliminary first lower insulation layer 116 are sequentially etched, and then the first lower sacrificial layer 104 is partially etched to form a third trench 148 having a bottom surface and a lower sidewall through which the first lower sacrificial layer 104 is exposed. The third trench 148 corresponds to a word line cutting region. Accordingly, the third trench 148 may extend in the first direction.

In exemplary embodiments, the third trench 148 is formed by forming a hard mask on the mold structure and performing a dry etch process using the hard mask as an etching mask.

In exemplary embodiments, the third trench 148 has a third width. The third width is greater than the thickness of the first lower sacrificial layer 104.

In exemplary embodiments, a protection layer is conformally formed on a sidewall and the bottom surface of the third trench 148 and is then anistropically etched to form a protection spacer 150. The protection spacer 150 protects the sacrificial layers 130, the insulation layers 132, the second lower insulation layer 128 and the preliminary lower insulation layer 116 from being exposed to subsequent etching processes. The protection spacer includes silicon nitride.

Figure 27:
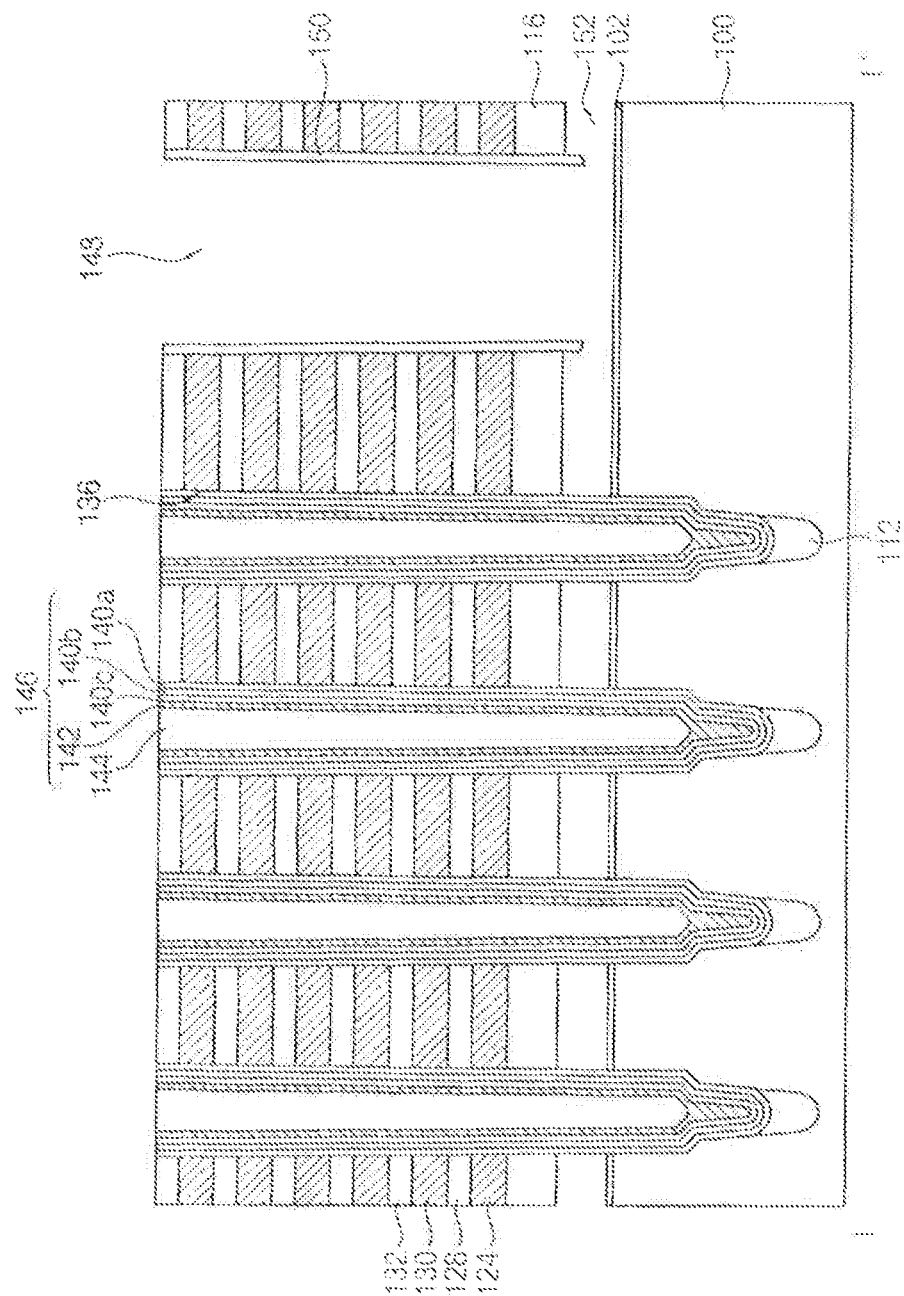
Figure 28:
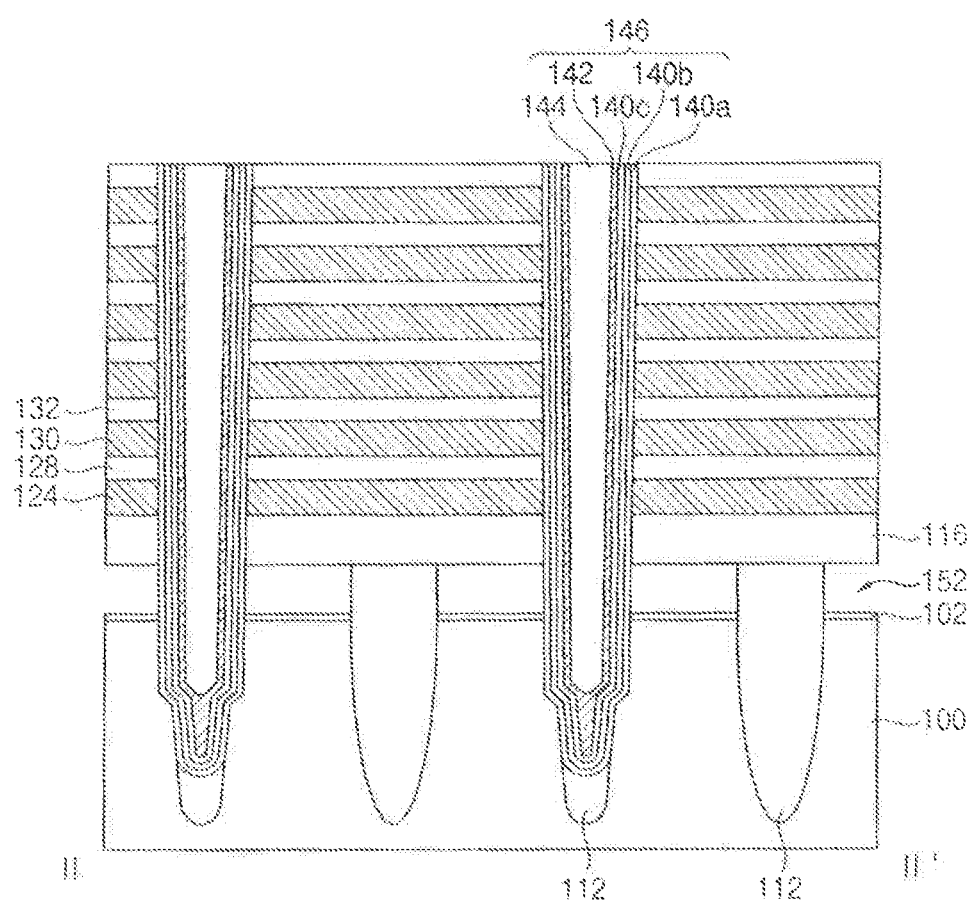
Figure 29:
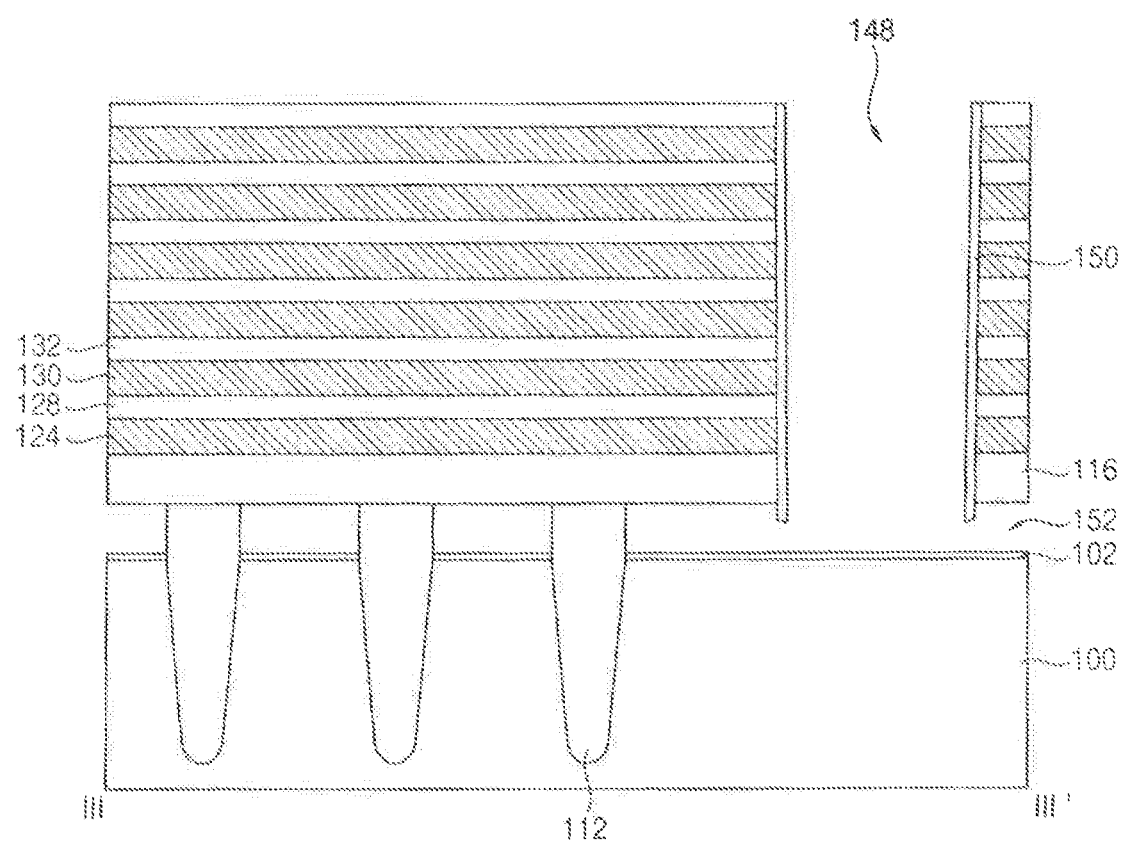

Referring to FIGS. 27, 28 and 29, according to exemplary embodiments, the first lower sacrificial layer 104 exposed through the lower sidewall and the bottom surface of the third trench 148 is selectively removed to form a first gap 152.

In exemplary embodiments, the first lower sacrificial layer 104 is removed by an isotropic etch process. The isotropic etch process includes a wet etch or a dry etch.

Accordingly, in exemplary embodiments, the pad insulation layer 102 and the preliminary lower insulation layer 116 are exposed by the first gap 152, respectively. A portion of a lower sidewall of the preliminary channel structure 146 is exposed by the first gap 152. The exposed portion of the preliminary channel structure 146 has an annular cylindrical shape.

In exemplary embodiments, while performing the isotropic etch process, the preliminary support pattern 112 and the preliminary channel structure 146 support the mold structure above the first lower sacrificial layer 104.

Figure 30:
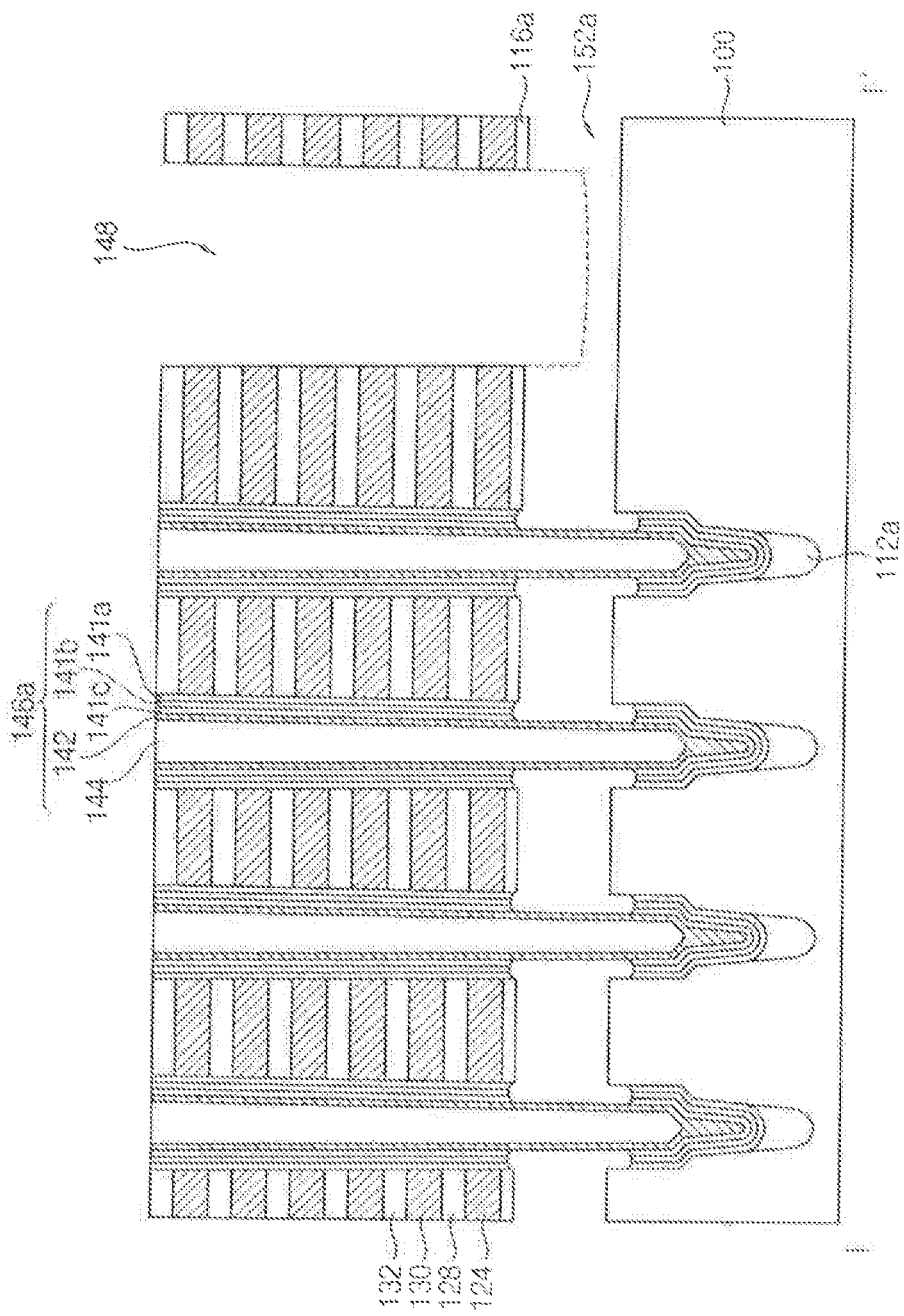
Figure 31:
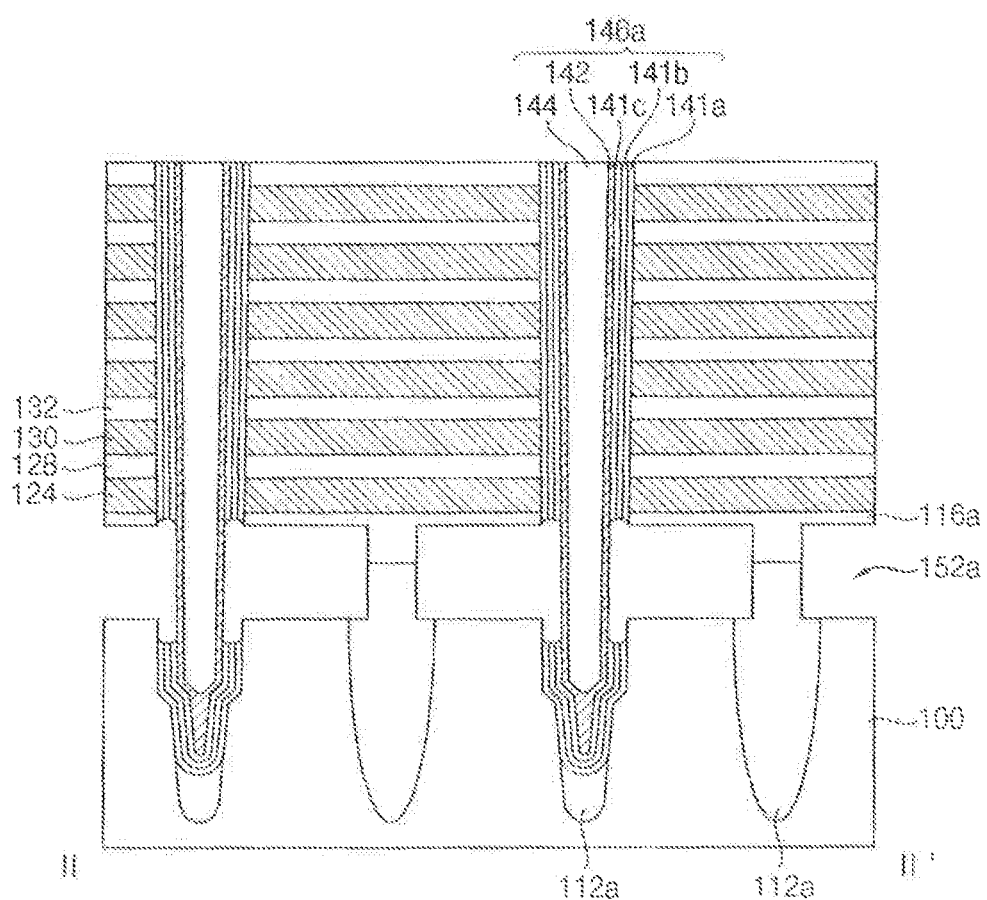
Figure 32:
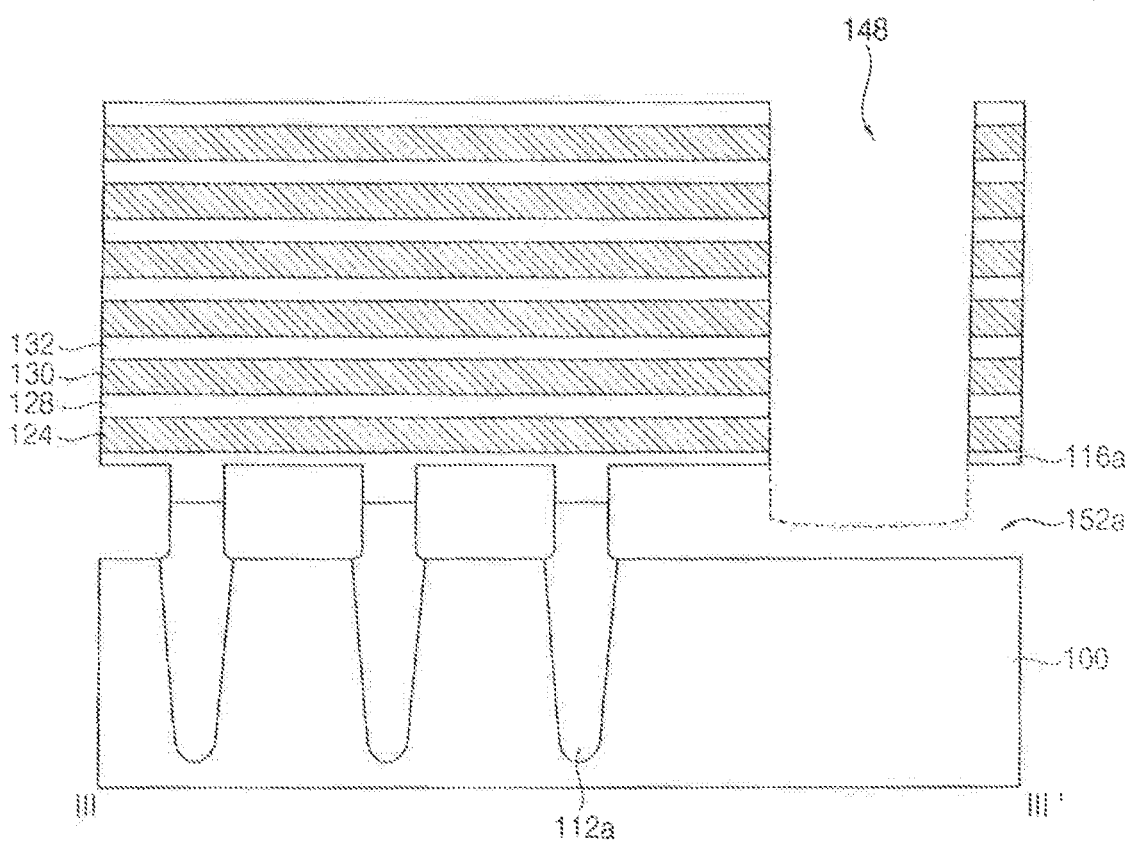

Referring to FIGS. 30, 31 and 32, according to exemplary embodiments, the preliminary blocking layer 140*a*, the preliminary charge storage layer 140*b* and the preliminary tunnel insulation layer 140*c* exposed by the first gap 152 are sequentially removed to form a channel structure 146*a*. The channel structure 146*a* includes a blocking layer 141*a*, a charge storage layer 141*b*, a tunnel insulation layer 141*c*, the channel layer 142 and the buried insulation layer 144.

In exemplary embodiments, a bottom surface of the channel structure 146*a* is positioned lower than the top surface of the substrate 100. The preliminary blocking layer 140*a*, the preliminary charge storage layer 140*b* and the preliminary tunnel insulation layer 140*c* in the lower portion of the channel structure 146*a* are not removed and remain behind.

That is, according to exemplary embodiments, each of the blocking layer 141*a*, the charge storage layer 141*b* and the tunnel insulation layer 141*c* are severed in the lower sidewall of the channel structure, and each of the blocking layer 141*a*, the charge storage layer 141*b* and the tunnel insulation layer 141*c* below the lower sidewall of the channel structure has a continuous, unbroken shape. The channel layer 142 is exposed through the severed portions of the blocking layer 141*a*, the charge storage layer 141*b* and the tunnel insulation layer 141*c*.

In exemplary embodiments, preliminary blocking layer 140*a*, the preliminary charge storage layer 140*b* and the preliminary tunnel insulation layer 140*c* are removed by an isotropic etch process. The isotropic etch process may include a wet etch or a dry etch.

In exemplary embodiments, the preliminary blocking layer 140*a* and the preliminary tunnel insulation layer 140*c* are removed by a wet etch process that uses an etchant that includes phosphoric acid. The preliminary charge storage layer 140*b* is removed by a wet etching process that uses an etchant that includes sulfuric acid.

In exemplary embodiments, a portion of the preliminary first lower insulation layer 116 is removed while removing the preliminary blocking layer 140*a* and the preliminary tunnel insulation layer 140*c*, and a first lower insulation layer 116*a* is formed with a thickness less than the thickness of the preliminary first lower insulation layer 116. The thickness of the first lower insulation layer 116*a* is less than or equal to a thickness of each of the second lower insulation layer 128 and the insulation layers 132. In some embodiments, the first lower insulation layer 116*a* serves as a gate insulation layer for a ground selection transistor.

In exemplary embodiments, the pad insulation layer 102 is removed while removing the preliminary blocking layer 140*a* and the preliminary tunnel insulation layer 140*c*, and the substrate 100 is exposed. Accordingly, by removing the preliminary blocking layer 140*a* and the preliminary tunnel insulation layer 140*c*, a width of the first gap 152 in the third direction increases to form a second gap 152*a* wider than the first gap 152. The second gap 152*a* is connected to the third trench 148.

In exemplary embodiments, in a subsequent layer deposition process, while the second gap 152*a* is filled, the third trench 148 should not be completely filled. Therefore, a height of the second gap 152*a* in the third direction is less than the third width of the third trench 148. In exemplary embodiments, the height of the second gap 152 in the third direction is less than a half of the third width.

In exemplary embodiments, the sidewall of the preliminary support pattern 112 is exposed by the removing of the preliminary blocking layer 140a and the preliminary tunnel insulation layer 140c. Accordingly, a support pattern 112a is formed that is narrower than the preliminary support pattern 112.

In exemplary embodiments, when the preliminary blocking layer 140a, the preliminary charge storage layer 140b and the preliminary tunnel insulation layer 140c are removed, the first lower insulation layer 116a is formed with a target thickness and the support pattern 112a is formed with a target width. That is, when the preliminary blocking layer 140a and the preliminary tunnel insulation layer 140c are removed, the exposed portions of the preliminary first lower insulation layer 116 and the preliminary support pattern 112 should not be completely removed.

In exemplary embodiments, in a process of removing the preliminary charge storage layer 140b, the protection spacer 150 on the sidewall of the third trench 148 is also removed.

Figure 33:
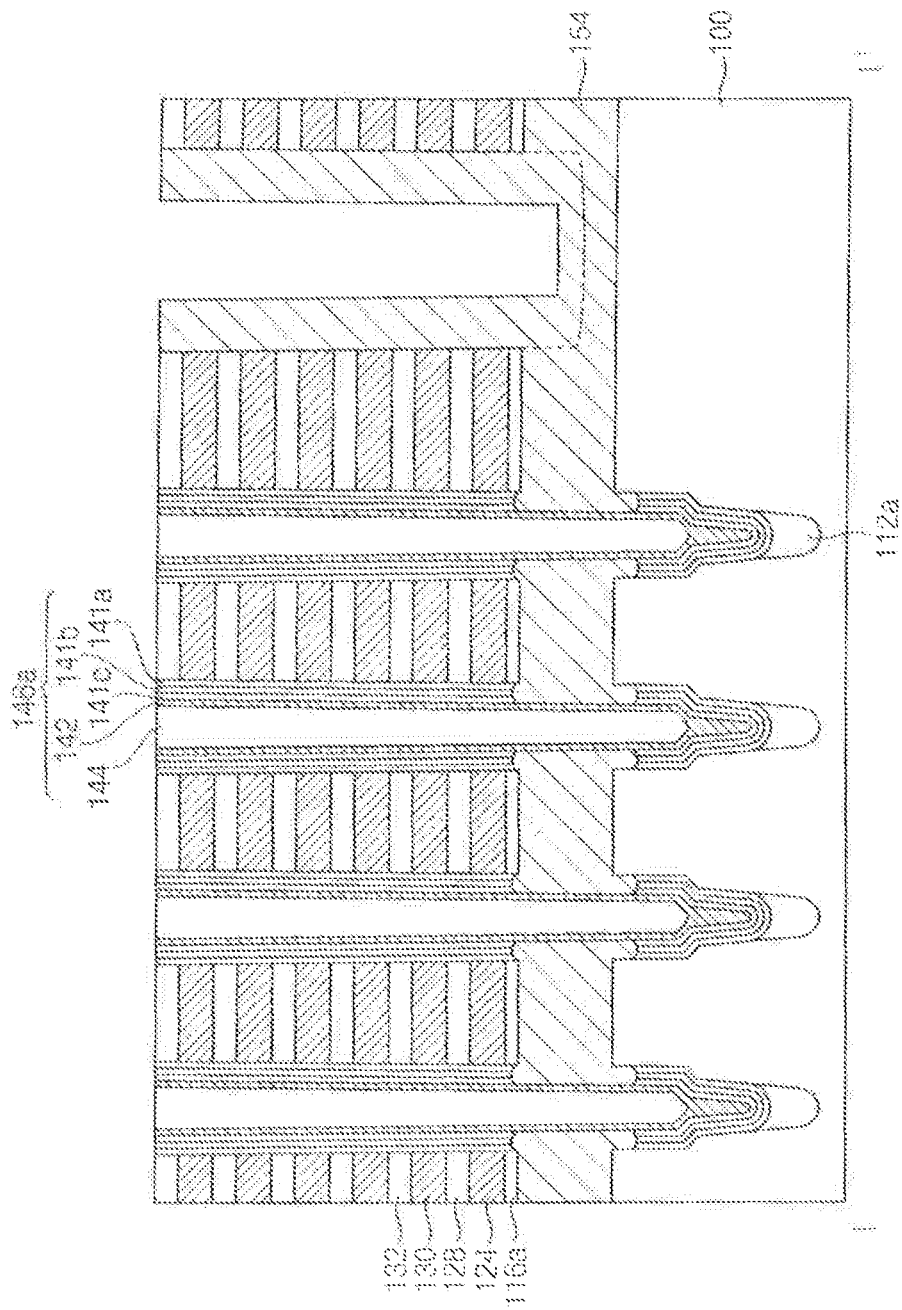
Figure 34:
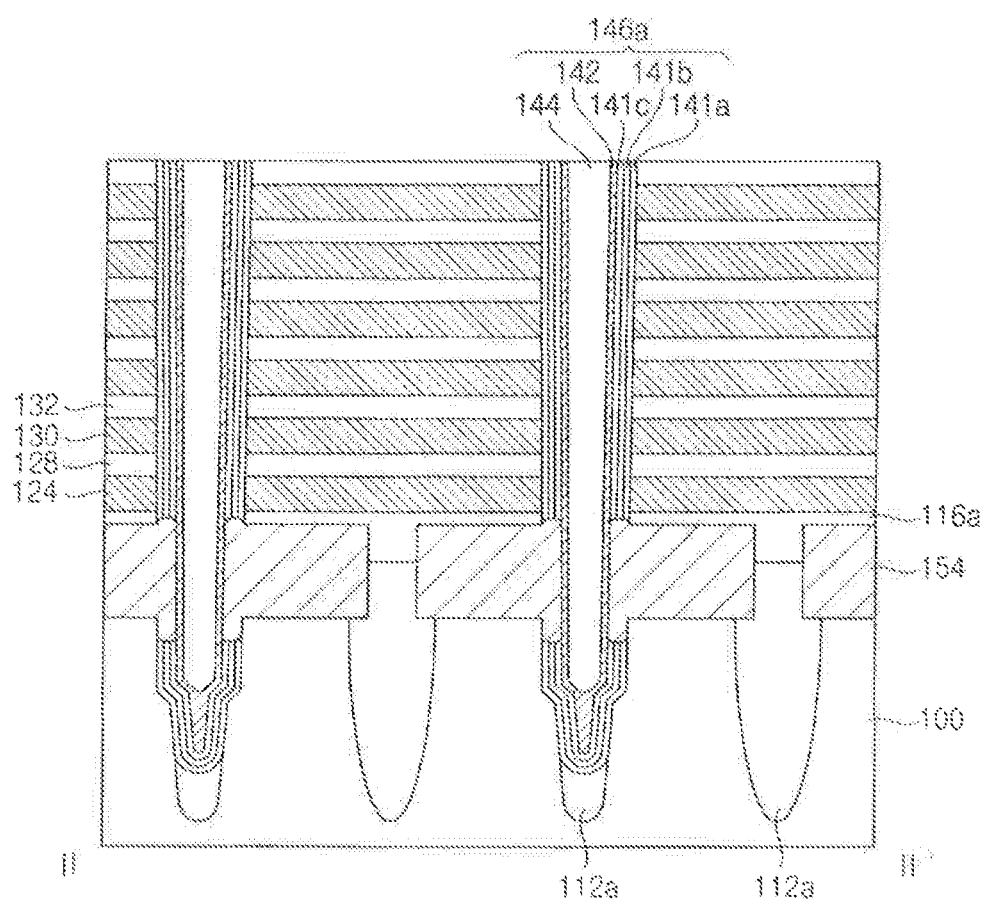
Figure 35:
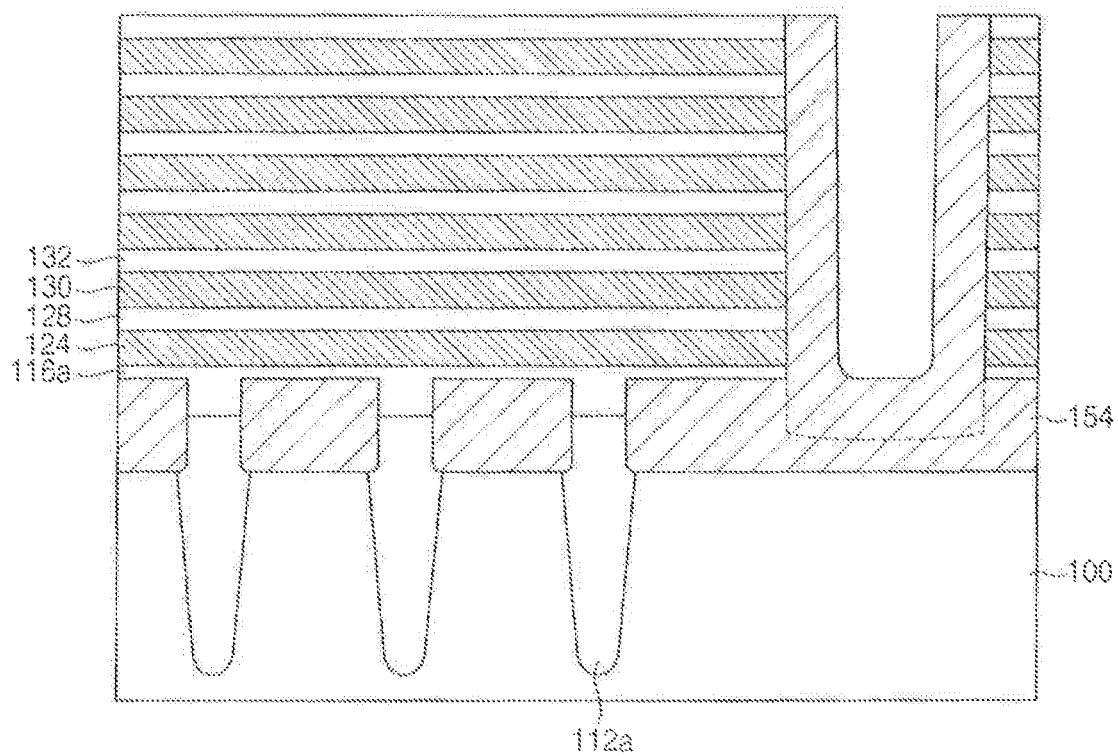

Referring to FIGS. 33, 34 and 35, according to exemplary embodiments, a preliminary polysilicon layer 154 is formed on the sidewall of the third trench 148 to completely fill the second gap 152a.

In exemplary embodiments, the preliminary polysilicon layer 154 within the second gap 152a is formed on the substrate 100 and makes contact with the channel layer 142. The channel structure 146a or the support pattern 112a are disposed between the preliminary polysilicon layers 154 in the second gap 152a.

In exemplary embodiments, due to the presence of the preliminary polysilicon layer 154, an epitaxial process is not needed to form a semiconductor pattern on the substrate 100. Because no semiconductor pattern is formed, failures caused by non-uniform growth of silicon in the epitaxial process are prevented. Further, there is no need to form a thicker insulation layer on the semiconductor pattern in consideration of the epitaxial process. Accordingly, the thickness of the insulation layer between the ground selection line and the word line can be reduced, and thus, a total thickness of the cell structure is reduced.

In exemplary embodiments, the blocking layer 141a, the charge storage layer 141b and the tunnel insulation layer 141c is not removed from the bottom surface of the channel structure 146a. Accordingly, errors caused by a removal process can be prevented.

Then, referring again to FIGS. 1, 2, 3 and 4, according to exemplary embodiments, the preliminary polysilicon layer 154 on the sidewall of the third trench 148 is removed to form a polysilicon layer 154a. By performing a removal process, the sacrificial layers 130, the insulation layers 132, the first and second lower insulation layers 116a, 128 and the second lower sacrificial layer 124 are exposed.

Then, according to exemplary embodiments, the sacrificial layers 130 and the second lower sacrificial layer 124 are selectively removed to form a third gap.

In exemplary embodiments, a first metal layer is formed to fill the third gap. The first metal layer includes tungsten. Before forming the first metal layer, a first barrier layer is conformally formed on a surface of the third gap. The first barrier layer may include titanium, titanium nitride, tantalum, tantalum nitride, etc.

In exemplary embodiments, the first metal layer and the first barrier layer formed on the sidewall of the third trench 148 and adjacent to the third trench 148 are partially removed to form a first recess portion. The first recess portion connects to the third trench 148. As the first recess portion is formed, the conductive layers formed at each level separate into respective first conductive patterns 160. The first conductive pattern 160 at the lowermost level serves as a ground selection line, and the first conductive patterns 160 formed on the ground selection line serve as a word line and a string selection line. As an example, the first conductive pattern 160 in the uppermost level serves as the string election line.

In exemplary embodiments, an insulation layer is formed on the sidewall of the third trench 148 that fills the first recess portion, and then, anisotropically etched. Accordingly, an insulation spacer 162 is formed on the sidewall of the third trench 148. The insulation spacer 162 includes silicon oxide.

In exemplary embodiments, a second metal layer is formed on the insulation spacer 162 that fills the third trench 148. The second metal layer includes tungsten. The second metal layer, a second barrier layer conformally formed on the insulation spacer 162 and the bottom surface of the third trench 148. The second barrier layer may include titanium, titanium nitride, tantalum, tantalum nitride, etc.

In exemplary embodiments, the second metal layer and the second barrier layer are planarized so that the second metal layer and the second barrier layer remain within the third trench 148 and form a second conductive pattern 164. A bottom surface of the second conductive pattern 164 makes contact with the polysilicon layer 154a. The second conductive pattern 164 extends in the first direction. The second conductive pattern 164 serves as a common source line.

Then, according to exemplary embodiments, a bit line contact and a bit line can be formed on the channel structure 146a and are electrically connected to the channel layer 142 of the channel structure 146a. Thus, a vertical type semiconductor device is completed.

Figure 36:
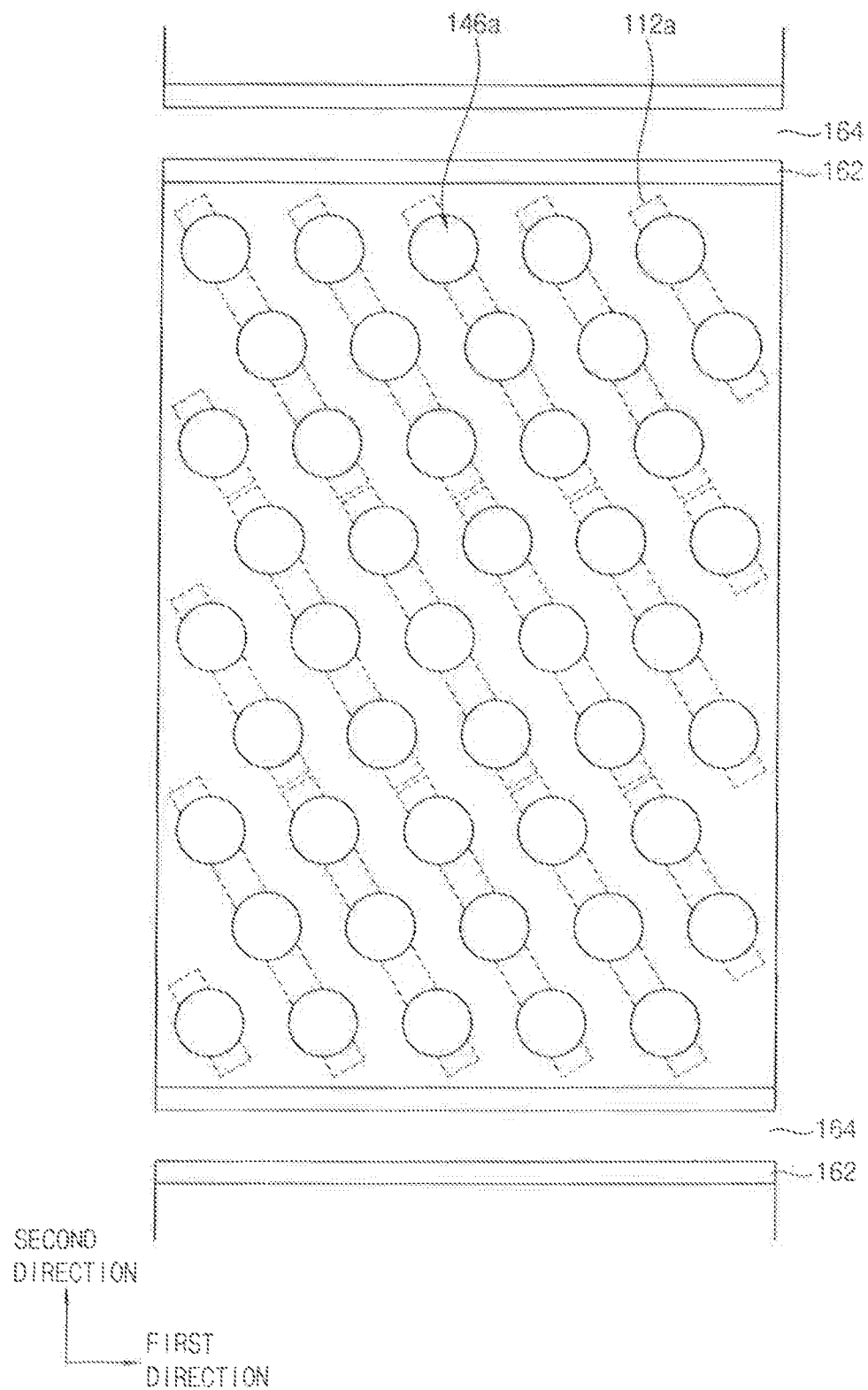
FIG. 36 is a plan view of a vertical type semiconductor device in accordance with exemplary embodiments.

FIG. 36 is a plan view of a vertical type semiconductor device in accordance with exemplary embodiments.

A vertical type semiconductor device according to exemplary embodiments is substantially the same as a vertical type semiconductor device as illustrated in FIG. 1, except for a shape of a support pattern.

Referring to FIG. 36, according to exemplary embodiments, support patterns 112a are positioned in a cell block region and extend in a diagonal direction that forms an acute angle with respect to a first direction. The support patterns 112a are severed. Accordingly, the support patterns 112a are spaced apart from each other in the diagonal direction.

A method of manufacturing a vertical type semiconductor device is substantially the same as a method described with reference to FIGS. 5 to 35. However, a first trench may be formed by a differently shaped etching mask.

Figure 37:
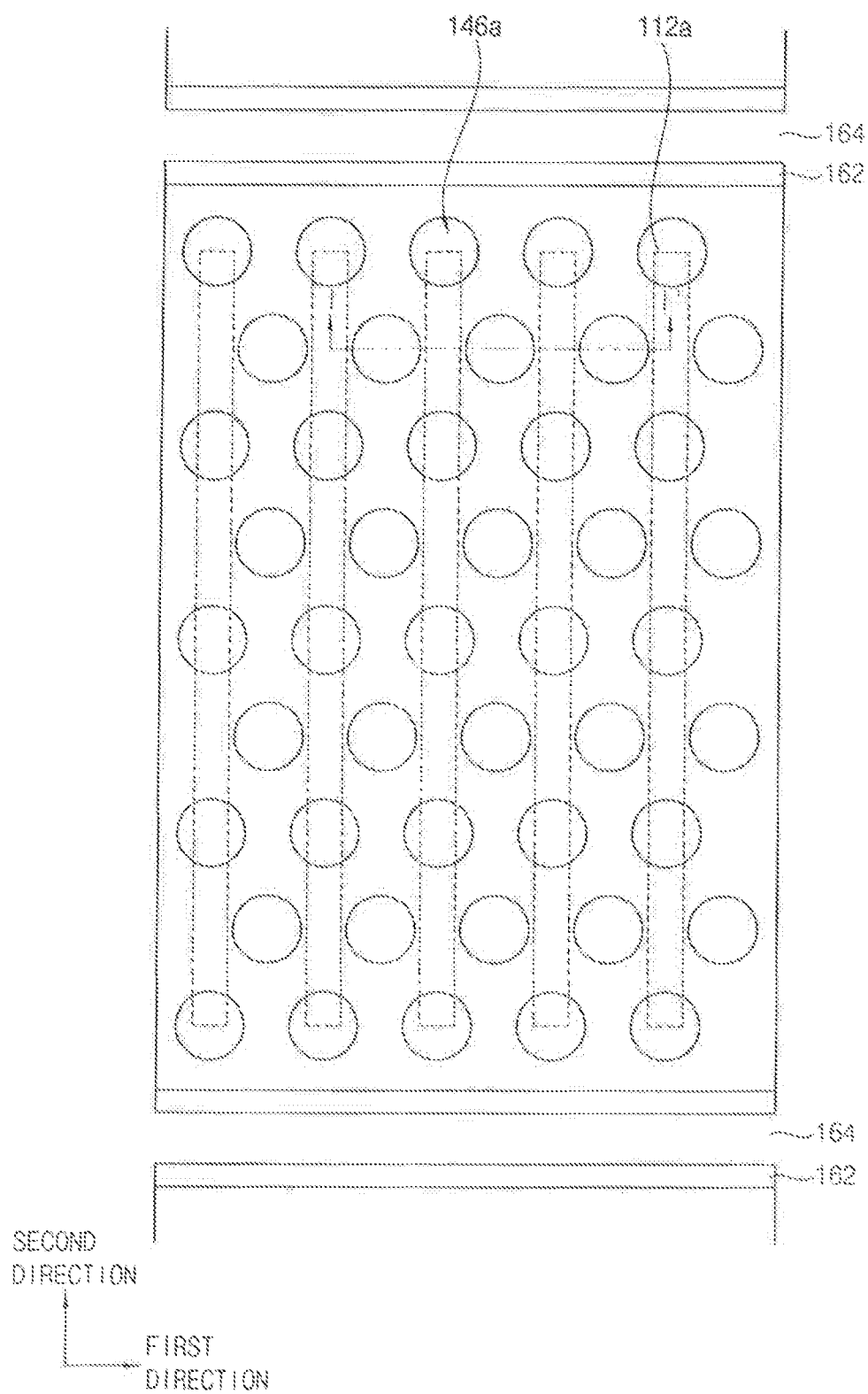
FIGS. 37 and 38 are a plan view and a cross-sectional view of a vertical type semiconductor device in accordance with exemplary embodiments.
Figure 38:
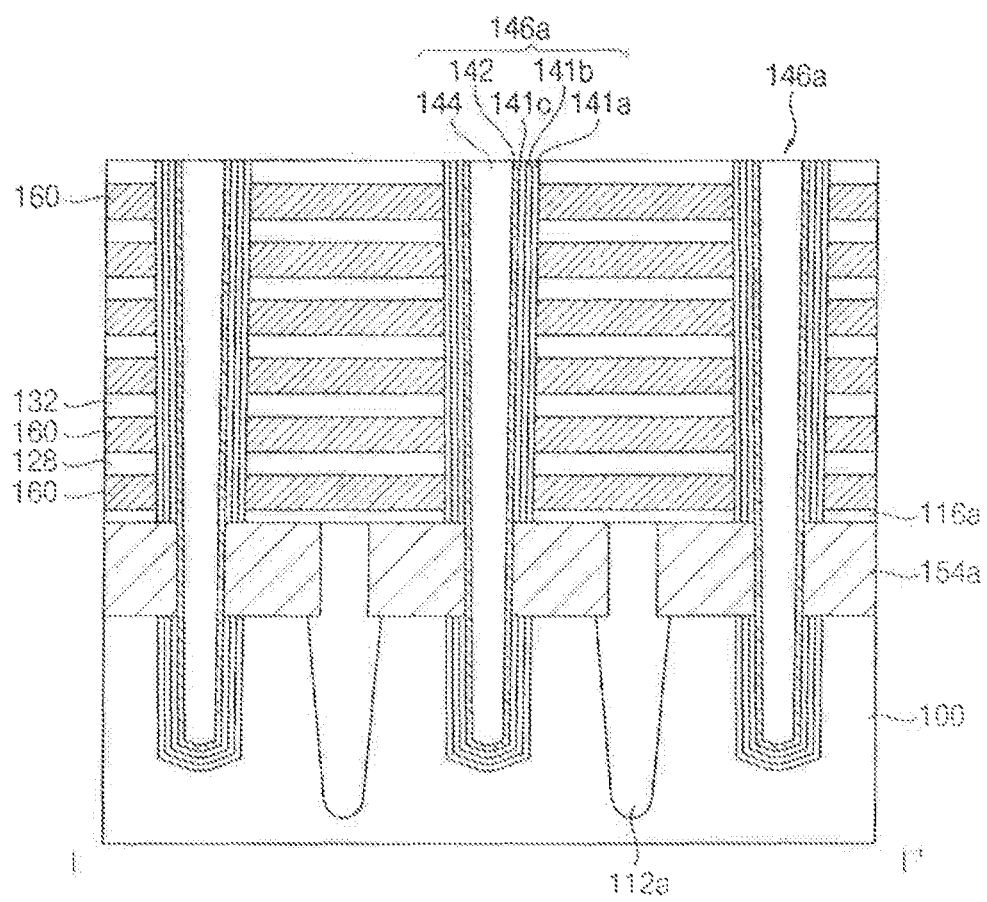

FIGS. 37 and 38 are a plan view and a cross-sectional view of a vertical type semiconductor device in accordance with exemplary embodiments.

FIG. 38 is a cross-sectional view taken along a line I-I' in FIG. 37.

A vertical type semiconductor device is substantially the same as a vertical type semiconductor device as illustrated in FIG. 1, except for a shape of a support pattern.

Referring to FIGS. 37 and 38, according to exemplary embodiments, support patterns 112a is positioned in a cell block region and extends in a second direction.

In exemplary embodiments, some channel structures 146a are disposed on the support patterns 112a, and other channel structures 146a are disposed on a substrate. As an example, the channel structures 146a in even-numbered rows extend into the support patterns 112a, and the channel structures 146a in odd-numbered rows extend into the substrate between the support patterns 112a. In this case, about a half of the channel structures 146a are disposed on the support pattern 112a.

In exemplary embodiments, each of the support patterns 112a in the cell block region extends in the second direction. In some embodiments, the support patterns 112a are severed. In this case, the support patterns 112a are spaced apart from each other in the first direction.

As illustrated in the figures, according to exemplary embodiments, the support patterns 112a in alternate rows are disposed between the channel structures 146a. A polysilicon layer 154a fills a gap between a lower portion of the channel structures 146a and the support patterns 112a.

Figure 39:
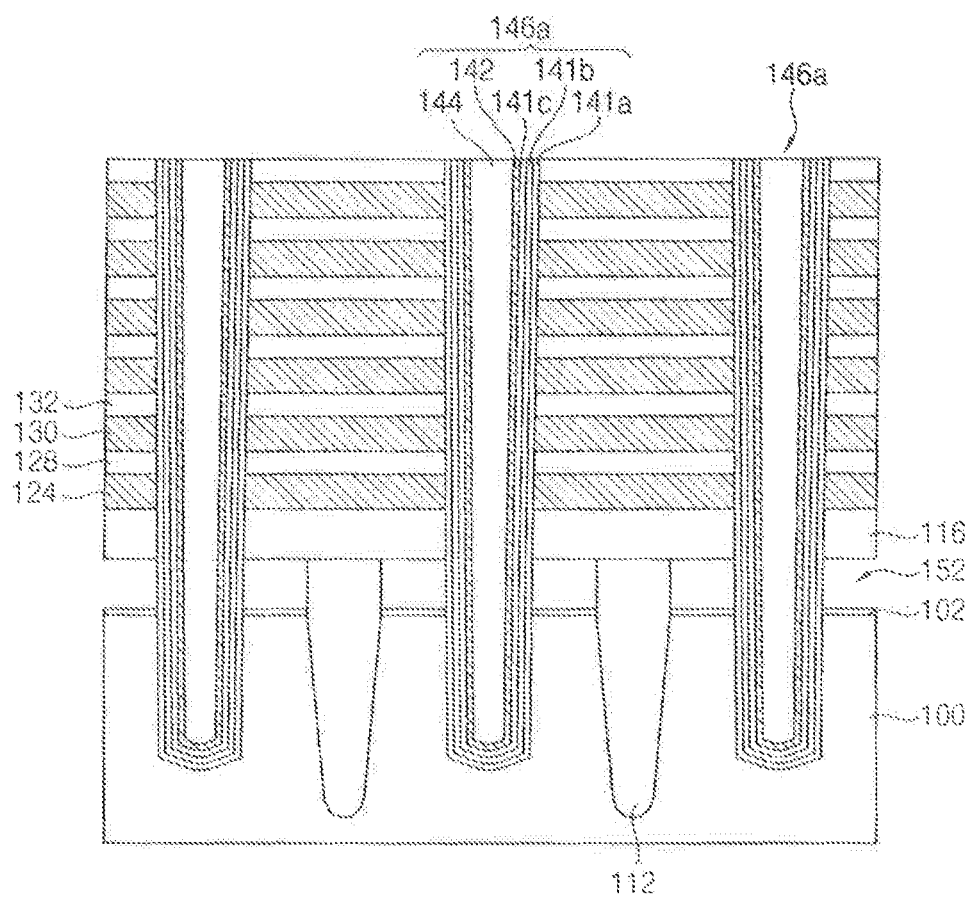
FIGS. 39 and 40 are cross-sectional views of a vertical type semiconductor device in accordance with exemplary embodiments.
Figure 40:
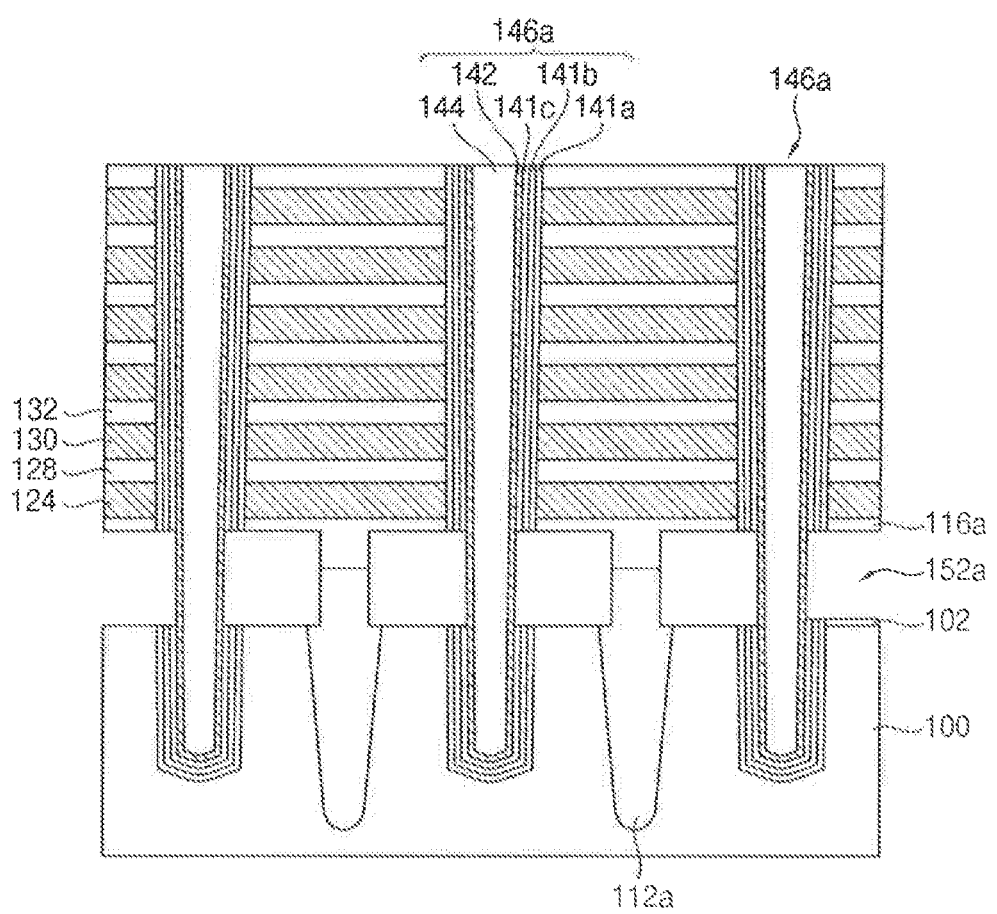

FIGS. 39 and 40 are cross-sectional views of a vertical type semiconductor device in accordance with exemplary embodiments.

A method of manufacturing a vertical type semiconductor device is substantially the same as a method described with reference to FIGS. 5 to 35. However, a first trench is formed by a differently shaped etching mask.

As illustrated in FIG. 39, according to exemplary embodiments, when a first lower sacrificial layer is removed to form a first gap 152, a preliminary channel structure 146 and a preliminary support pattern 112 support a mold structure.

As illustrated in FIG. 40, according to exemplary embodiments, when portions of a preliminary blocking layer 140a, a preliminary charge storage layer 140b and a preliminary tunnel insulation layer 140c exposed by the first gap 152 are removed, the preliminary support pattern 112 is also partially removed. Accordingly, an upper width of the preliminary support pattern 112 thinner than the preliminary support pattern 112.

Figure 41:
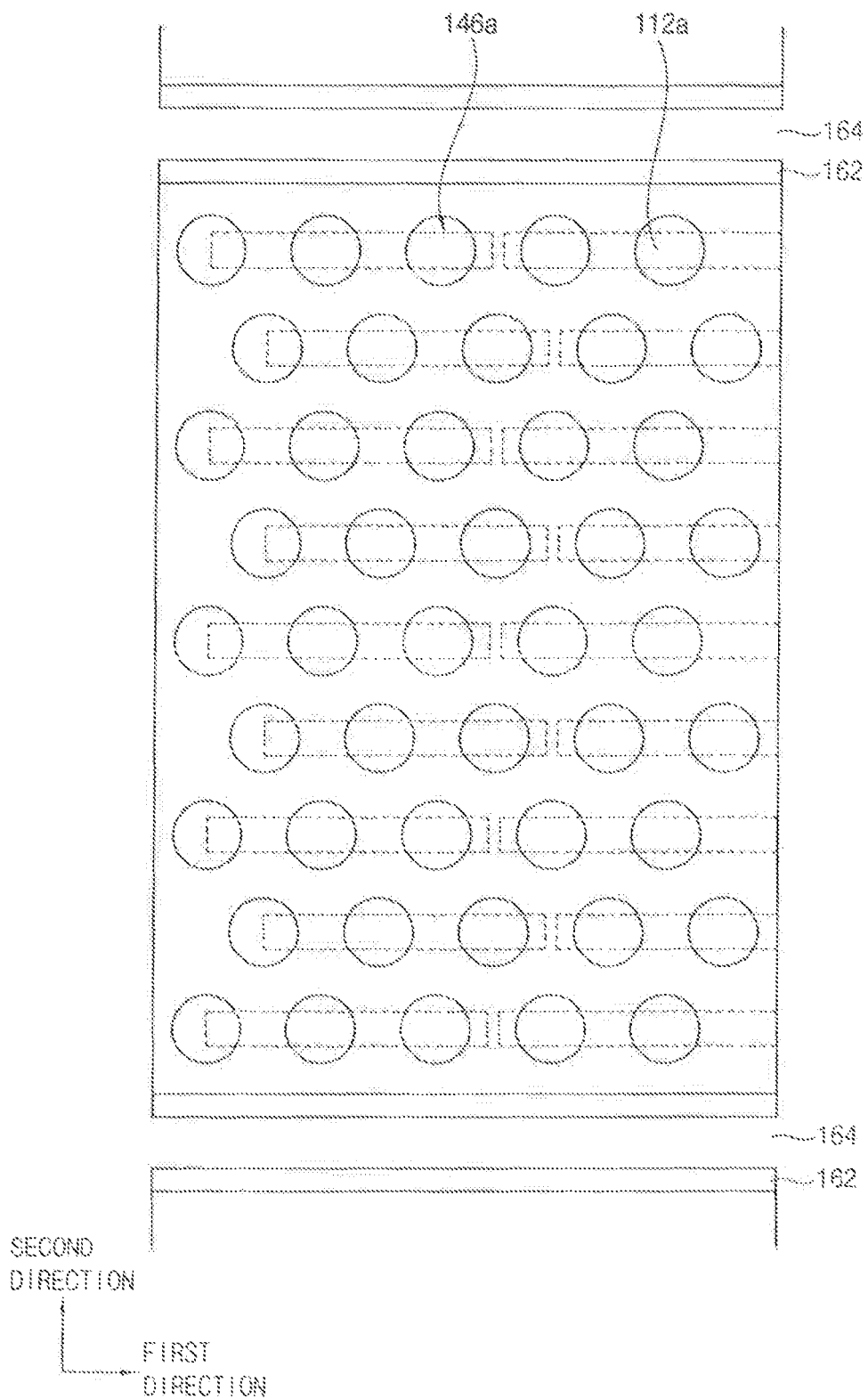
FIG. 41 is a plan view of a vertical type semiconductor device in accordance with exemplary embodiments.

FIG. 41 is a plan view of a vertical type semiconductor device in accordance with exemplary embodiments.

In exemplary embodiments, the vertical type semiconductor device is substantially the same as a vertical type semiconductor device as illustrated in FIG. 1, except for a shape of a support pattern.

Referring to FIG. 41, according to exemplary embodiments, support patterns 112a are positioned in a cell block region and extend in a first direction. The support patterns 112a spaced apart along a second direction.

In exemplary embodiments, the support patterns 112a are severed along the first direction. The support patterns 112a are spaced apart from each other in the first direction.

In exemplary embodiments, at least some of channel structures 146a are disposed on the support pattern 112a. In exemplary embodiments, all of the channel structures 146a are disposed on the support pattern 112a.

A method of manufacturing a vertical type semiconductor device is substantially the same as a method described with reference to FIGS. 5 to 35. However, the first trench is formed by a differently shaped etching mask.

Figure 42:
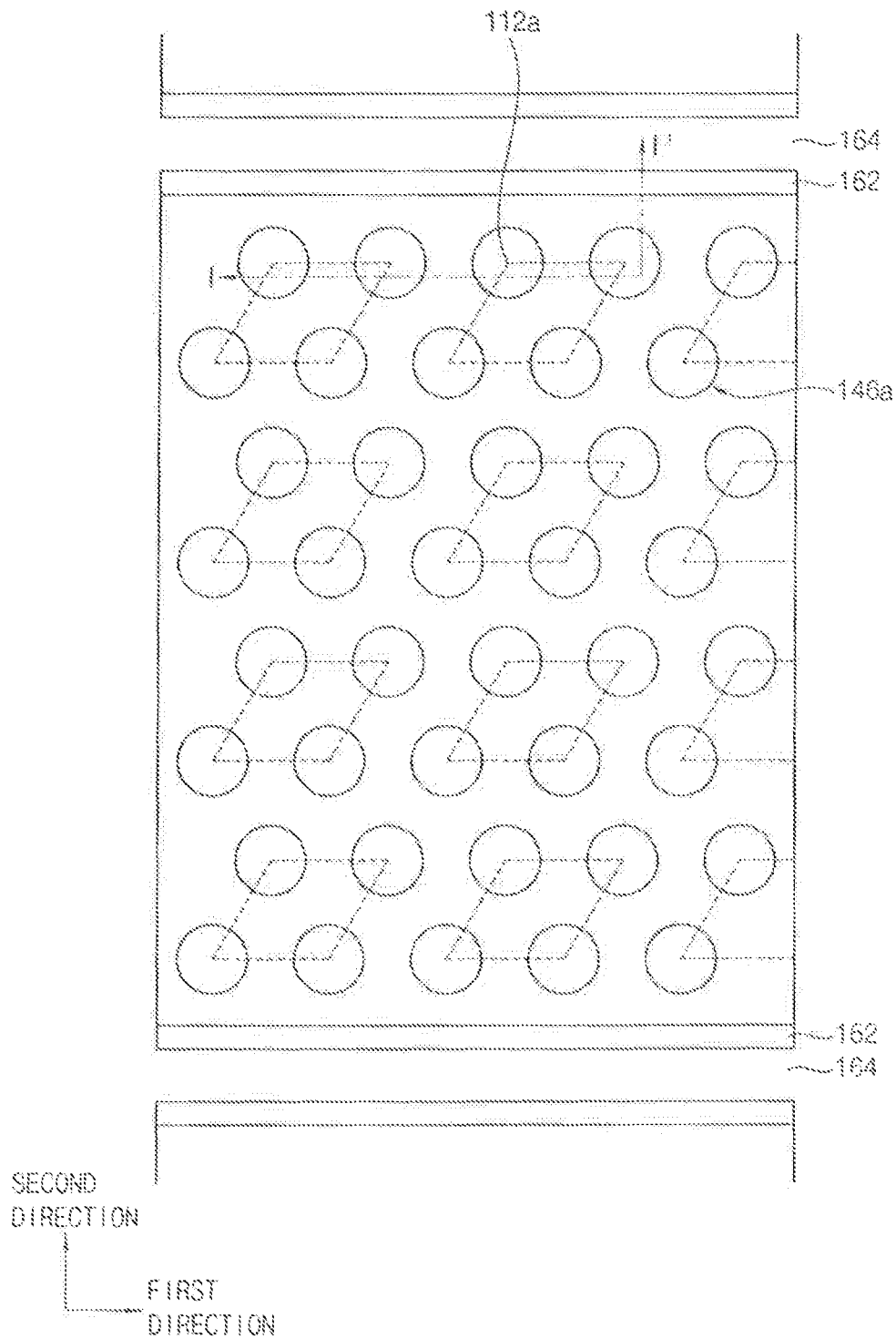
FIGS. 42 and 43 are a plan view and a cross-sectional view of a vertical type semiconductor device in accordance with exemplary embodiments.
Figure 43:
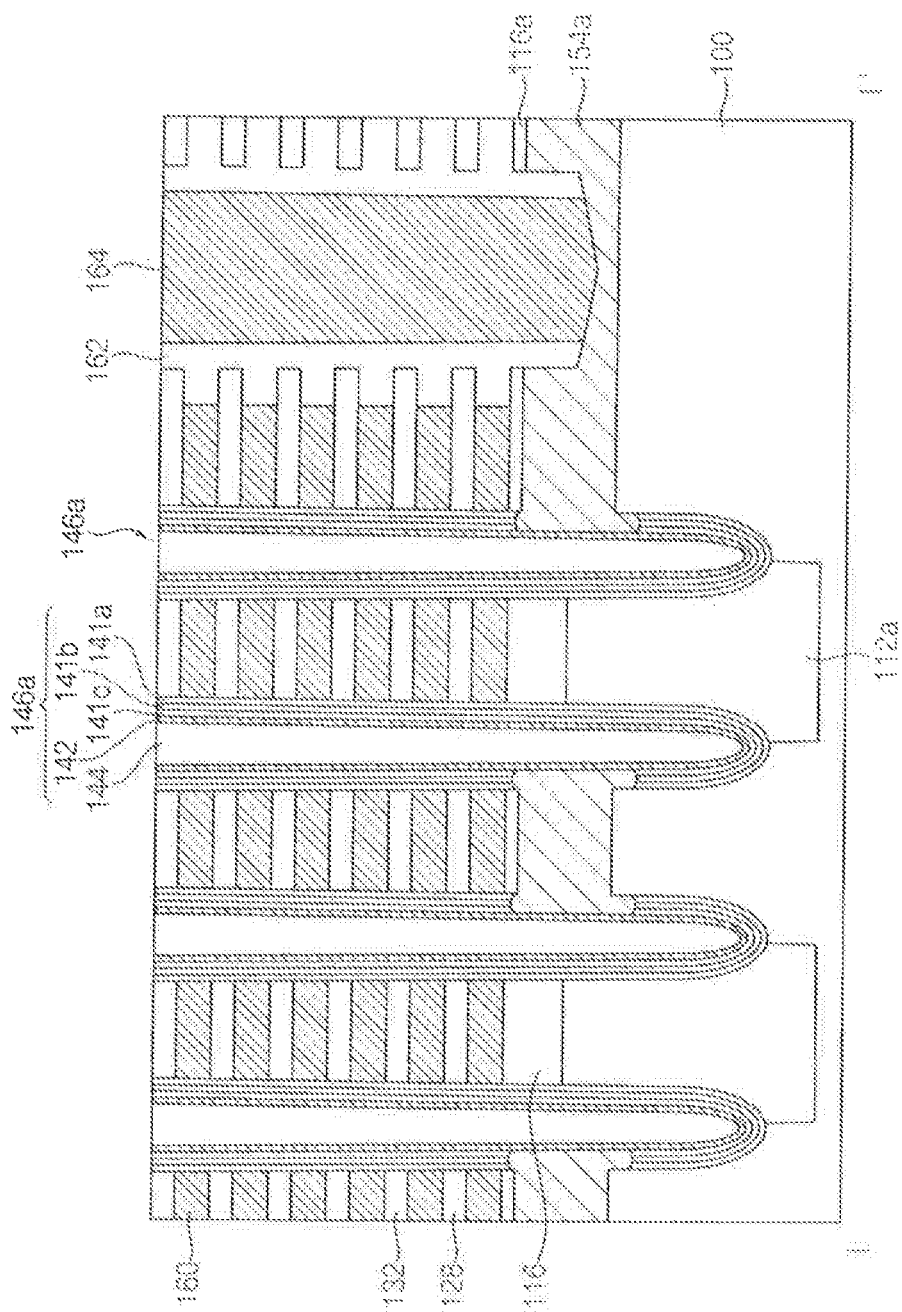

FIGS. 42 and 43 are a plan view and a cross-sectional view of a vertical type semiconductor device in accordance with exemplary embodiments.

A vertical type semiconductor device is substantially the same as a vertical type semiconductor device as illustrated in FIG. 1, except for shapes of a support pattern and a channel structure.

Referring to FIGS. 42 and 43, according to exemplary embodiments, support patterns 112a are positioned in a cell block region and have a pillar shape.

In exemplary embodiments, each of the support patterns 112a is disposed under a plurality of channel structures 146a. That is, lower portions of a plurality of adjacent channel structures 146a make contact with one support pattern 112a. Hereinafter, an exemplary, non-limiting case of four channel structures 146a being disposed on one support pattern 112a will be described.

In exemplary embodiments, the support pattern 112a fills a lower space between four channel structures 146a. In particular, in a plan view, a polygonally shaped space formed by virtual lines that connect the four adjacent channel structures is filled with the support pattern 112a. Accordingly, the support pattern 112a makes contact with lower sidewalls and bottom surfaces of the four channel structures 146a. That is, the lower sidewall of each of the channel structures 146a includes a portion that contacts the support pattern 112a and a portion that does not contact the support pattern 112a. The non-contacting portion of the channel structure makes contact with a polysilicon layer 154a.

In exemplary embodiments, the support pattern 112a protrudes from a top surface of a substrate 100. The top surface of the support pattern 112a is lower than a top surface of the polysilicon layer 154a. A preliminary first lower sacrificial layer 116 is provided on the support pattern 112a. A thickness of the preliminary first lower sacrificial layer 116 on the support pattern 112a is greater than a thickness of the preliminary first lower sacrificial layer 116 on the polysilicon layer 154a.

In exemplary embodiments, the channel structure 146a penetrates through insulation layers 116, 128, 132, first conducive patterns 160 and the polysilicon layer 154a and extends into the support pattern 112a.

In exemplary embodiments, the channel structure 146a is disposed within a channel hole. The channel structure 146a includes a blocking layer 141a, a charge storage layer 141b, a tunnel insulation layer 141c, a channel layer 142 and a buried insulation layer 144 sequentially stacked on a sidewall of the channel hole.

In exemplary embodiments, a surface of the channel structure 146a includes a first portion that makes contact with the support pattern 112a and a second portion that does not make contact with the support pattern 112a.

In exemplary embodiments, the blocking layer 141a is severed in the second portion at a height at the same level as the polysilicon layer 154a. However, a portion of the blocking layer 141a higher than the polysilicon layer 154a, a portion of the blocking layer 141a lower than the polysilicon layer 154a, and a portion of the blocking layer 141a in the second portion at the same height as the polysilicon layer 154a are connected to each other.

In exemplary embodiments, the charge storage layer 141b and the tunnel insulation layer 141c are severed in the second portion at a same height as the polysilicon layer 154a. That is, portions of the charge storage layer 141b and the tunnel insulation layer 141c higher than the polysilicon layer 154a, portions of the charge storage layer 141b and the tunnel insulation layer 141c lower than the polysilicon layer 154a, and portions of the charge storage layer 141b and the tunnel insulation layer 141c in the second portion at the same height as the polysilicon layer 154a are connected to each other, respectively.

Accordingly, in exemplary embodiments, the channel layer 142 exposed through the severed portion of the blocking layer 141a, the charge storage layer 141b and the tunnel insulation layer 141c makes contact with the polysilicon layer. The contacting portion between the channel layer 142 and the polysilicon layer 154a has a semi-annular shape.

In exemplary embodiments, the channel layer 142 and the buried insulation layer 144 have shapes substantially the same as those described above with reference to FIG. 2.

FIGS. 44 to 49 are a plan view and cross-sectional views of a vertical type semiconductor device in accordance with exemplary embodiments.

FIGS. 45 to 49 are cross-sectional views taken along a line I-I' in FIG. 44.

A method of manufacturing a vertical type semiconductor device is substantially the same as a method described with reference to FIGS. 5 to 35. However, an opening for forming a support pattern is formed by a differently shaped etching mask, and thus, a channel structure has a different shape.

Figure 45:
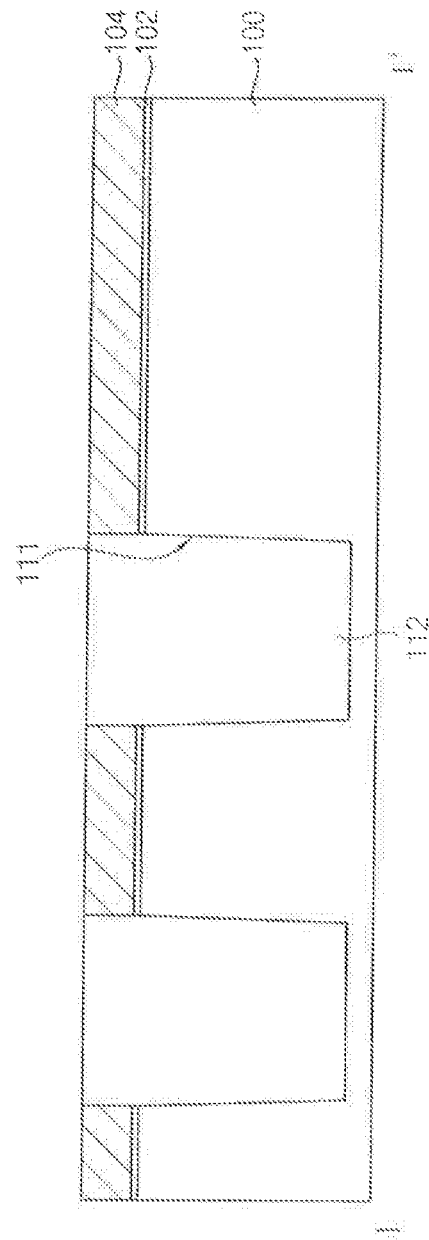

Referring to FIGS. 44 and 45, according to exemplary embodiments, an opening III is formed in a cell region of a substrate 100. The opening 111 is formed by a process substantially the same as a process for forming a first trench as described with reference to FIGS. 5 to 7. However, the opening 111 overlaps a plurality of adjacent channel structures to be formed by a subsequent process.

In exemplary embodiments, a process substantially the same as a process described with reference to FIGS. 8 and 9 is performed to form a preliminary support pattern 112 in the opening 111.

Then, in exemplary embodiments, processes substantially similar to those described with reference to FIGS. 10 to 25 are performed.

Figure 46:
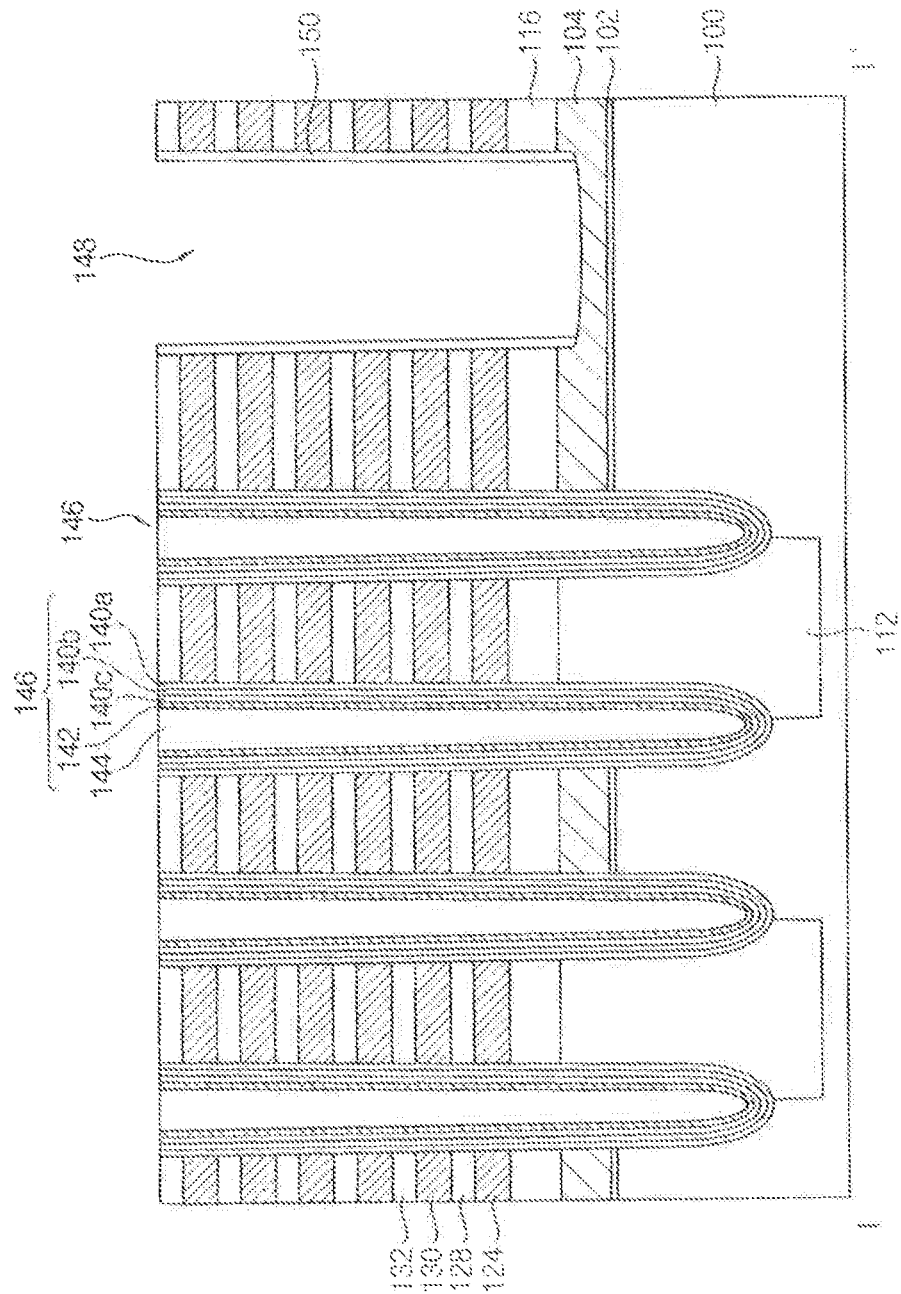

In exemplary embodiments, by performing processes illustrated by FIG. 46, a portion of a bottom surface of each of a plurality of adjacent preliminary channel structures 146 are disposed on one preliminary support pattern 112. A lower space between adjacent preliminary channel structures 146 is filled with the preliminary support pattern 112. Accordingly, a lower sidewall of the preliminary channel structure 146 includes a portion in contact with the preliminary support pattern 112 and a portion not in contact with the preliminary support pattern 112. A first lower sacrificial layer 104 is exposed through a lower sidewall and a bottom surface of a third trench 148.

Figure 47:
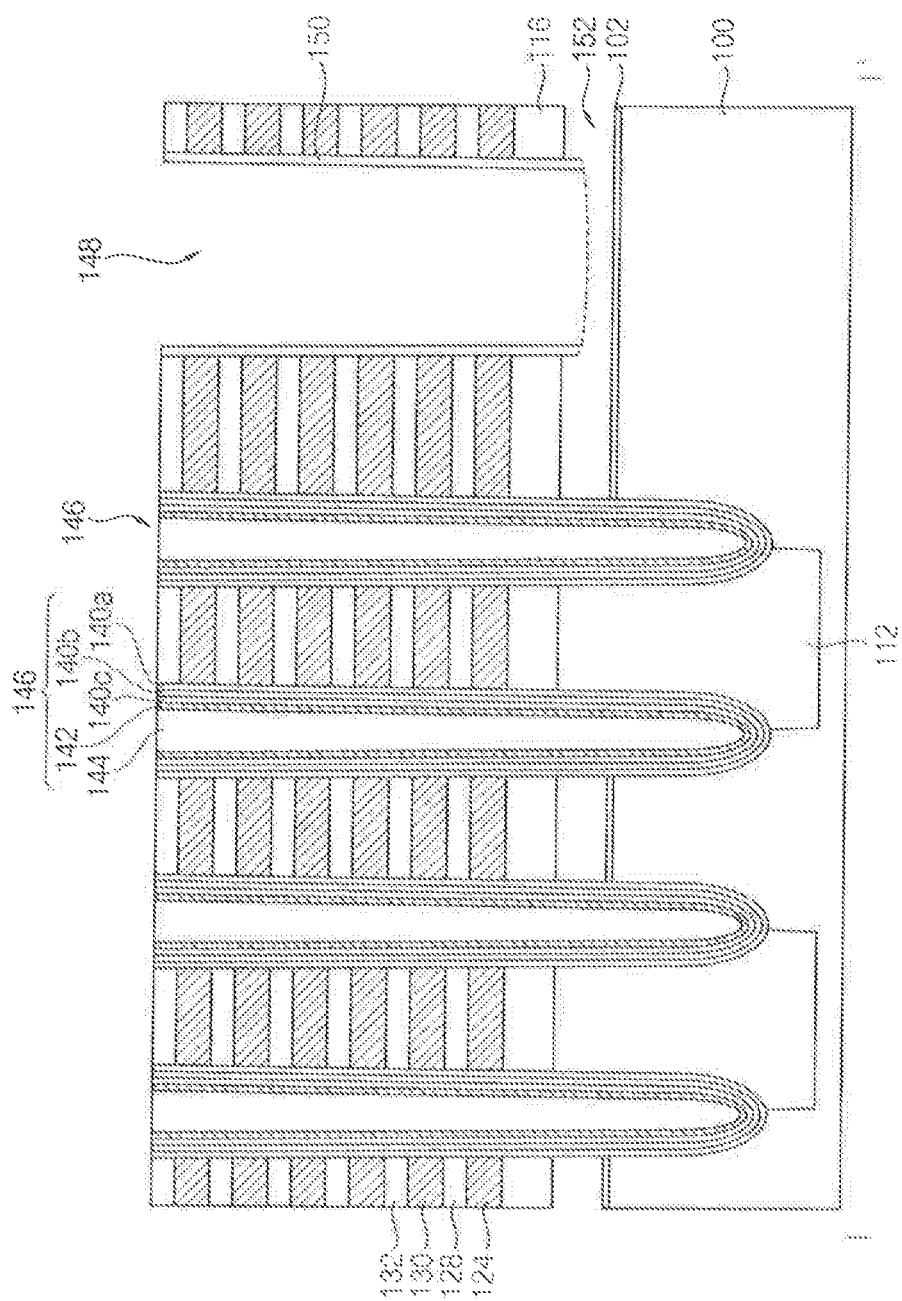

Referring to FIG. 47, according to exemplary embodiments, the first lower sacrificial layer exposed by the third trench 148 is removed to form a first gap 152. Accordingly, a portion of the lower sidewall of the preliminary channel structure 146 is exposed through the first gap 152.

In exemplary embodiments, when the first gap 152 is formed, the preliminary support pattern 112 is not removed. Therefore, because the lower space between the plurality of preliminary channel structures 146 is filled with the preliminary support pattern 112, the lower sidewalls of the preliminary channel structures 146 that contact the preliminary support pattern 112 are not exposed.

In exemplary embodiments, the preliminary support pattern 112 connects the bottom surface and lower sidewalls of the plurality of preliminary channel structures 146. The preliminary support pattern 112 supports the mold structure thereon.

In exemplary embodiments, processes substantially the same as processes described with reference to FIGS. 27 to 29 are performed.

Referring to FIG. 48, according to exemplary embodiments, portions of a preliminary blocking layer 140a, a preliminary charge storage layer 140b and a preliminary tunnel insulation layer 140c exposed by the first gap 152 are sequentially removed to form a channel structure 146a. The channel structure 146a includes a blocking layer 141a, a charge storage layer 141b, a tunnel insulation layer 141c, a channel layer 142 and a buried insulation layer 144.

In exemplary embodiments, portions of the preliminary blocking layer 140a, the preliminary charge storage layer 140b and the preliminary tunnel insulation layer 140c in contact with the preliminary support pattern 112 are not removed.

In exemplary embodiments, while removing the preliminary blocking layer 140a and the preliminary tunnel insulation layer 140c, a portion of the preliminary first lower insulation layer 116 exposed by the first gap 152 is removed to form a first lower insulation layer 116a that is thinner than the preliminary first lower insulation layer 116. However, because an etch source gas is blocked from being supplied to the preliminary first lower insulation layer 116, the thickness of that portion of the preliminary first lower insulation layer 116 is not reduced. In addition, while removing the preliminary blocking layer 140a and the preliminary tunnel insulation layer 140c, the sidewall of the preliminary support pattern 112 exposed by the first gap 152 is partially etched to form a support pattern 112a.

In exemplary embodiments, while removing the preliminary blocking layer 140a and the preliminary tunnel insulation layer 140c, a second gap 152a is formed having an increased height in a third direction greater than that of the first gap 152.

In exemplary embodiments, processes substantially the same as processes described with reference to FIGS. 30 to 32 are performed.

Referring to FIG. 49, according to exemplary embodiments, a preliminary polysilicon layer 154 is formed on the sidewall of the third trench 148 to completely fill the second gap 152a.

In exemplary embodiments, the preliminary polysilicon layer 154 makes contact with a portion of a lower sidewall of the channel layer 142.

In exemplary embodiments, processes substantially the same as processes described with reference to FIGS. 33 to 35 are performed.

Then, according to exemplary embodiments, subsequent processes as described with reference to FIGS. 1, 2, 3 and 4 are performed to form a vertical type semiconductor device in FIGS. 42 and 43.

While exemplary embodiments have been particularly shown and described, it will be understood by one of ordinary skill in the art that variations in form and detail may be made therein without departing from the spirit and scope of the claims.

What is claimed is:

1. A vertical type semiconductor device, comprising:
   a substrate that has a plurality of first trenches extending in a first direction parallel to a top surface of the substrate;
   support patterns that fill the plurality of first trenches and protrude from the top surface of the substrate;
   a semiconductor layer disposed between the support patterns on the substrate;
   a stacked structure disposed on the support pattern and the semiconductor layer that includes a plurality of insulation layers and a plurality of first conducive patterns that are alternately and repeatedly stacked; and
   a plurality of channel structures that penetrate through the stacked structure and that extend into the support pattern, wherein each channel structure includes a channel layer,
   wherein at least a portion of the channel layer makes direct contact with the semiconductor layer.

2. The vertical type semiconductor device of claim 1, wherein the semiconductor layer comprises polysilicon.

3. The vertical type semiconductor device of claim 1, wherein the support pattern connects lower sidewalls of adjacent channel structures.

4. The vertical type semiconductor device of claim 1, wherein the support pattern extends to have a linear shape.

5. The vertical type semiconductor device of claim 1, wherein the support pattern has a pillar shape.

6. The vertical type semiconductor device of claim 5, wherein a plurality of adjacent channel structures are disposed on one of the support patterns.

7. The vertical type semiconductor device of claim 6, wherein the stacked structure has a linear shape that extends in a second direction, the support pattern is positioned in a cell block region and the support pattern extends in a diagonal direction that forms an acute angle with respect to the second direction.

8. The vertical type semiconductor device of claim 1, wherein a width of the portion of the support pattern that protrudes from the top surface of the substrate is less than a width of a portion of the support pattern in the first trenches.

9. The vertical type semiconductor device of claim 1, wherein each channel structure is disposed in a channel hole, and each channel structure comprises a blocking layer, a charge storage layer, a tunnel insulation layer and a channel layer sequentially stacked on a surface of the channel hole.

10. The vertical type semiconductor device of claim 9, wherein the blocking layer, the charge storage layer and the tunnel insulation layer expose a portion of the channel layer at a level of the semiconductor layer, and the exposed portion of the channel layer makes direct contact with the semiconductor layer.

11. The vertical type semiconductor device of claim 1, further comprising:
a plurality of stacked structures disposed on the support pattern that are spaced apart from each other, wherein each of the plurality of stacked structures has a linear shape that extends in a second direction,
wherein a second trench is provided between adjacent stacked structures.

12. The vertical type semiconductor device of claim 11, wherein a width of the second trench is greater than a thickness of the semiconductor layer.

13. The vertical type semiconductor device of claim 11, further comprising a second conductive pattern in the second trench, wherein the second conductive pattern contacts the semiconductor layer and extends in the second direction.

14. A vertical type semiconductor device, comprising:
a substrate that has a plurality of trenches extending in a first direction parallel to a top surface of the substrate;
support patterns that fill the plurality of trenches and protrude from the top surface of the substrate;
a polysilicon layer disposed between the support patterns on the substrate;
a stacked structure disposed on the support pattern and the polysilicon layer that includes a plurality of insulation layers and a plurality of first conducive patterns that are alternately and repeatedly stacked; and
a plurality of channel structures that penetrate through the stacked structure and that extend into the support pattern,
wherein the support pattern connects lower sidewalls of adjacent channel structures,
wherein a width of the support pattern that protrudes from the top surface of the substrate is less than a width the support pattern in the trenches.

15. The vertical type semiconductor device of claim 14, wherein the width of the support pattern that protrudes from the top surface of the substrate is less than a maximum width of the support pattern in the trenches.

16. The vertical type semiconductor device of claim 14, wherein each channel structure is disposed in a channel hole, and each channel structure comprises a blocking layer, a charge storage layer, a tunnel insulation layer and a channel layer sequentially stacked on a surface of the channel hole, wherein the channel layer makes contact with the polysilicon layer, and
wherein the blocking layer the charge storage layer and the tunnel insulation layer expose a portion of the channel layer at a level of the polysilicon layer, and the exposed portion of the channel layer makes direct contact with the polysilicon layer.

17. A vertical type semiconductor device, comprising:
a substrate that has a plurality of first trenches extending in a first direction parallel to a top surface of the substrate;
support patterns that fill the plurality of first trenches and that protrude from the top surface of the substrate;
a polysilicon layer disposed between the support patterns on the substrate;
a stacked structure on the support pattern and the polysilicon layer that includes a plurality of insulation layers and a plurality of first conducive patterns that are alternately and repeatedly stacked;
a plurality of first channel structures that penetrate through the stacked structure and that extend into the substrate, wherein each of the first channel structure includes a first channel layer; and
a plurality of second channel structures that penetrate through the stacked structure and that extend into the support pattern, wherein each of the second channel structures includes a second channel layer,
wherein at least a portion of each of the first channel layer and the second channel layer makes direct contact with the polysilicon layer.

18. The vertical type semiconductor device of claim 17, further comprising:
a plurality of stacked structures disposed on the support pattern that are spaced apart from each other, wherein each of the plurality of stacked structures has a linear shape that extends in a second direction,
wherein a second trench is provided between adjacent stacked structures.

19. The vertical type semiconductor device of claim 17, wherein the stacked structure has a linear shape that extends in a second direction, the support pattern is positioned in a cell block region and the support pattern extends in a diagonal direction that forms an acute angle with respect to the second direction.

20. The vertical type semiconductor device of claim 14, wherein a plurality of adjacent channel structures are disposed on one of the support patterns.

* * * * *